United States Patent
Lin et al.

(10) Patent No.: US 12,142,609 B2
(45) Date of Patent: Nov. 12, 2024

(54) DUMMY FIN BETWEEN FIRST AND SECOND SEMICONDUCTOR FINS

(71) Applicant: Taiwan Semiconductor Manufacturing Co., Ltd., Hsinchu (TW)

(72) Inventors: Shih-Yao Lin, New Taipei (TW); Yun-Ting Chou, Hsinchu (TW); Chih-Han Lin, Hsinchu (TW); Jr-Jung Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/354,844

(22) Filed: Jul. 19, 2023

(65) Prior Publication Data

US 2023/0361123 A1 Nov. 9, 2023

Related U.S. Application Data

(60) Division of application No. 17/567,476, filed on Jan. 3, 2022, now Pat. No. 11,764,222, which is a continuation of application No. 16/837,563, filed on Apr. 1, 2020, now Pat. No. 11,217,586.

(60) Provisional application No. 62/968,586, filed on Jan. 31, 2020.

(51) Int. Cl.
| | |
|---|---|
| *H01L 27/092* | (2006.01) |
| *H01L 21/311* | (2006.01) |
| *H01L 21/8238* | (2006.01) |
| *H01L 29/08* | (2006.01) |
| *H01L 29/66* | (2006.01) |

(52) U.S. Cl.
CPC .... *H01L 27/0924* (2013.01); *H01L 21/31111* (2013.01); *H01L 21/823821* (2013.01); *H01L 21/823828* (2013.01); *H01L 21/823864* (2013.01); *H01L 29/0847* (2013.01); *H01L 29/66545* (2013.01)

(58) Field of Classification Search
CPC ....... H01L 21/31111; H01L 21/823821; H01L 21/823828; H01L 21/823864; H01L 27/0924; H01L 29/0847; H01L 27/0886; H01L 27/1211; H01L 29/41791; H01L 29/66666; H01L 29/66795
USPC .................................................. 257/220, 302
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |

(Continued)

FOREIGN PATENT DOCUMENTS

KR 20190038401 A 4/2019

*Primary Examiner* — Hoai V Pham
(74) *Attorney, Agent, or Firm* — Slater Matsil, LLP

(57) ABSTRACT

An embodiment device includes a first source/drain region over a semiconductor substrate and a dummy fin adjacent the first source/drain region. The dummy fin comprising: a first portion comprising a first film and a second portion over the first portion, wherein the second portion comprises: a second film; and a third film. The third film is between the first film and the second film, and the third film is made of a different material than the first film and the second film. A width of the second portion is less than a width of the first portion. The device further comprises a gate stack along sidewalls of the dummy fin.

20 Claims, 57 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,090,303 B2 | 10/2018 | Cheng |
| 2017/0040324 A1 | 2/2017 | Yang et al. |
| 2018/0308933 A1 | 10/2018 | Tung |
| 2019/0103304 A1 | 4/2019 | Lin et al. |
| 2019/0221439 A1* | 7/2019 | Kim .................. H01L 27/0886 |
| 2019/0326287 A1 | 10/2019 | Liaw |
| 2020/0312849 A1 | 10/2020 | Cheng |

* cited by examiner

DUMMY FIN BETWEEN FIRST AND SECOND SEMICONDUCTOR FINS

PRIORITY CLAIM AND CROSS-REFERENCE

This application is a divisional of U.S. application Ser. No. 17/567,476, filed on Jan. 3, 2022, which is a continuation of U.S. application Ser. No. 16/837,563, filed on Apr. 1, 2020, now U.S. Pat. No. 11,217,586, issued on Jan. 4, 2022, which claims the benefit of U.S. Provisional Application No. 62/968,586, filed on Jan. 31, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
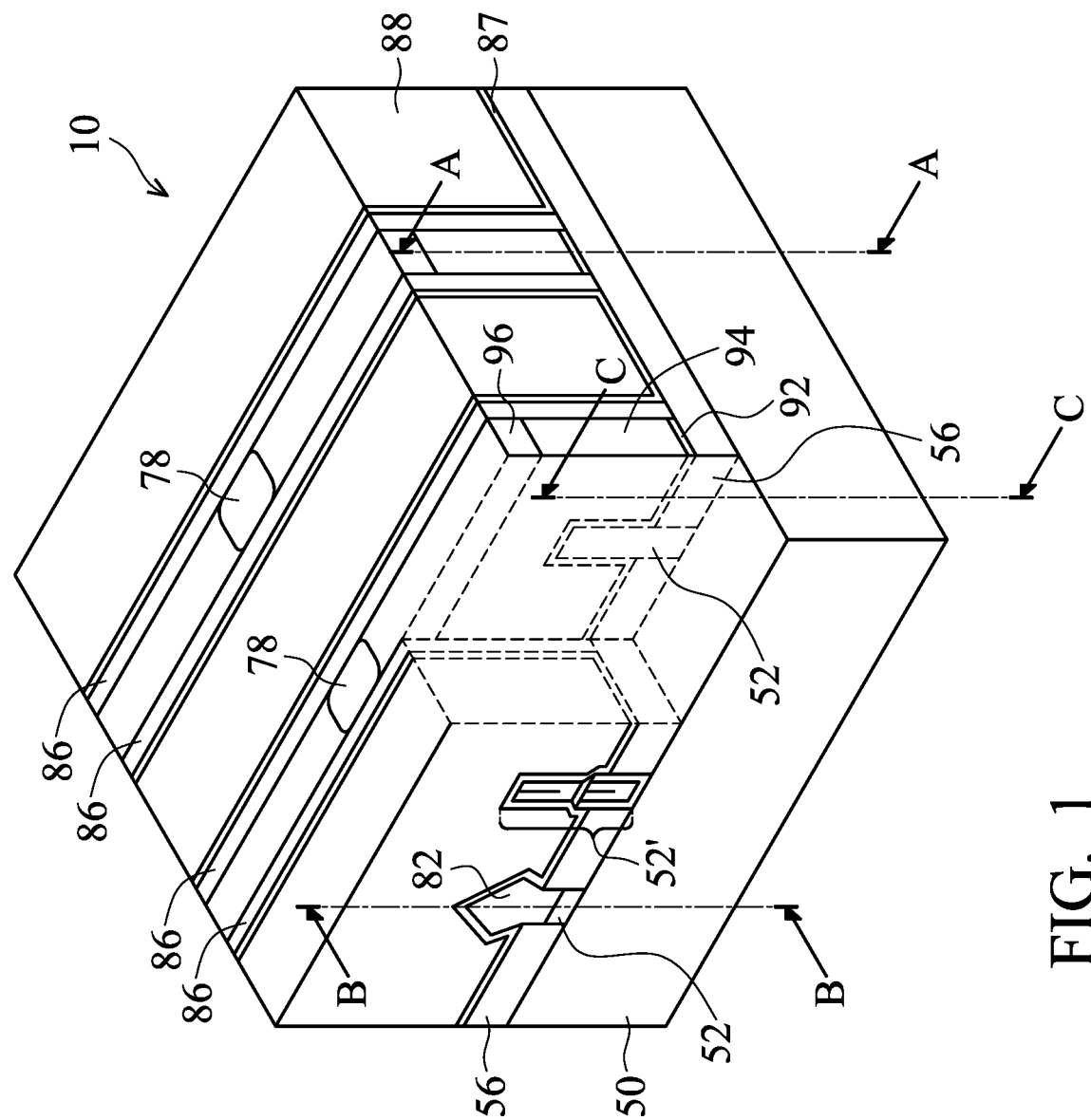
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described herein as applied to a fin field effect transistor (FinFET). Embodiments may be applied to other transistor technologies, including NanosheetFET (sometimes referred to as gate all around field effect transistors (GAAFET)), or the like.

In various embodiments, a dummy fin may be used to separate metal gates of adjacent transistors. The dummy fin may also help isolate adjacent source/drain regions by, for example, preventing unintended source/drain merging during an epitaxial growth process. It has been observed that dummy fin dimensions (sometimes referred to as critical dimensions (CD)) affects device yield because of the dummy fin's proximity to the channel regions of transistors. Various embodiments includes forming a film on sidewalls of the dummy fin and etching the film. Thus, a profile of the dummy fin can be improved. For example, a middle portion of the dummy fin may be less wide (e.g., have a smaller CD) than a bottom portion of the dummy fin. In this manner, a spacing between the dummy fin and the channel regions can be increased, and a process window for gate stack gap filling is enlarged.

FIG. 1 illustrates an example of a device 10 comprising FinFETs in a three-dimensional view, in accordance with some embodiments. A portion of the device 10 is cut away to illustrate underlying features (e.g., features outlined with dashed lines). The device 10 comprises fins 52 on a substrate 50 (e.g., a semiconductor substrate). Isolation regions 56 are disposed in the substrate 50, and the fins 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fins 52 is illustrated as a single, continuous material as the substrate 50, the fin 52 and/or the substrate 50 may comprise a single material or a plurality of materials. In this context, the fins 52 refers to the portion extending between the neighboring isolation regions 56. The device 10 further includes a dummy fin 52' between adjacent fins 52.

A gate dielectric layer 92 is along sidewalls and over a top surface of the fins 52, gate electrodes 94 are over the gate dielectric layer 92, and a gate mask layer 96 is over the gate electrodes 94. The gate dielectric layer 92, gate electrodes 94, and gate mask layer 96 may also be disposed on sidewalls of the dummy channel regions 52'. One or more layers of gate spacers 86 may be on sidewalls of the gate dielectric layer 92, the gate electrodes 94, and the gate mask layer 96. Source/drain regions 82 are disposed in opposite sides of the fin 52 with respect to the gate dielectric layer 92, the gate electrodes 94, and the gate mask layer 96. In some embodiments, the gate spacers 86 may also be optionally formed on sidewalls of the dummy fin 52' as well. The dummy fin 52' may be disposed between and physically separate adjacent source/drain regions 82. The source/drain regions 82 may also extend from a recessed portion of the fin 52A.

Figure 27A:
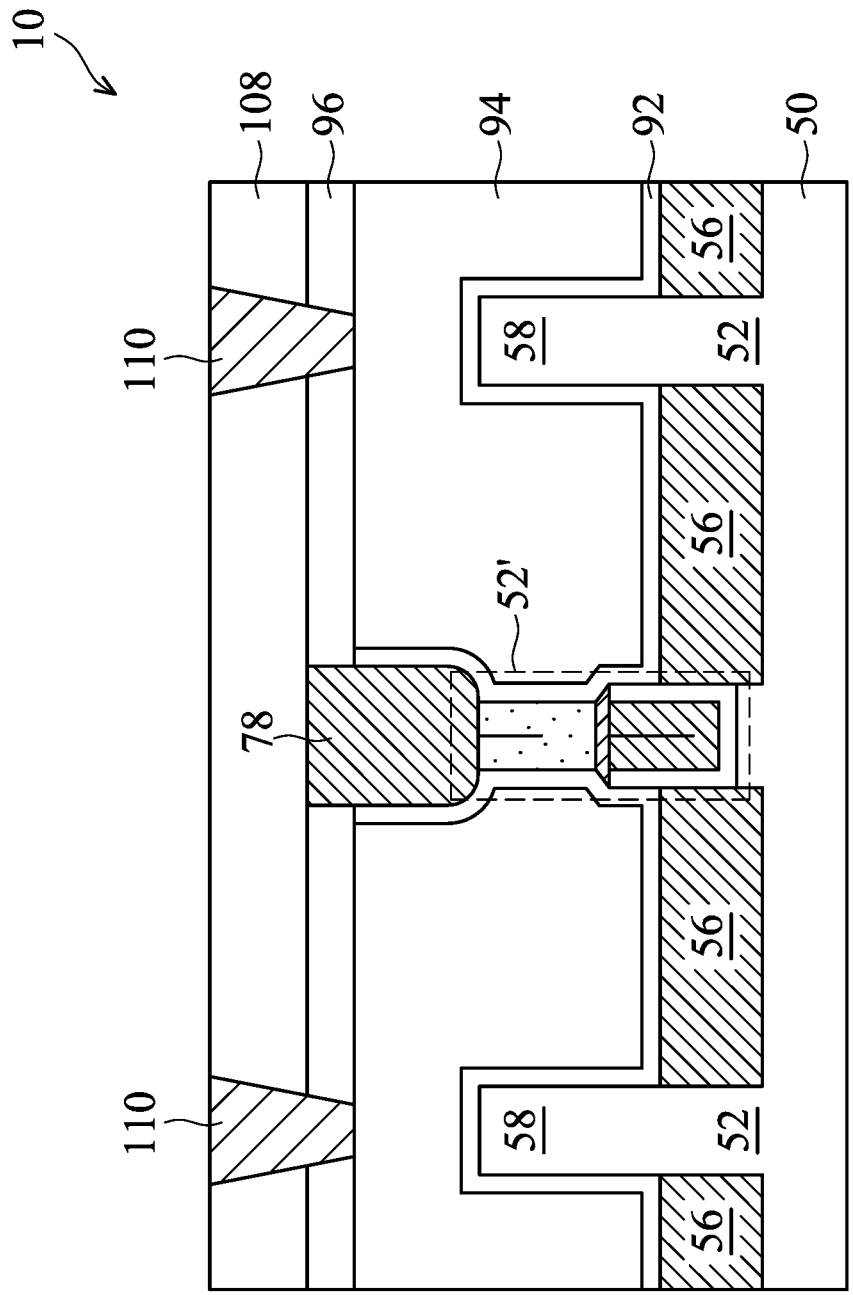

Dielectric regions 78 extend through the gate mask layers 96 into the gate electrodes 94 (see e.g., FIG. 27A). The dielectric regions 78 may extend to the dummy fin 52', and a combination of the dielectric region 78 and the dummy fin 52' may isolate gate electrodes of adjacent FinFETs. A contact etch stop layer (CESL) 87 is disposed over the isolation regions 56, and a dielectric layer 88 is disposed over the CESL 87. The dielectric layer 88 may further surround the source/drain regions 82, portions of the dummy fin 52', the gate mask layer 96, the gate dielectric layer 92, and the gate electrodes 94.

FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 37C are cross-sectional views of intermediate stages in the manufacturing of FinFETs, in accordance with some embodiments. FIGS. 2 through 14, 15A through 15H, 16A, 16B, 17, 29 through 35, and 36A through 36C illustrate reference cross-section A-A illustrated in FIG. 1, except for multiple fins/FinFETs. FIGS. 18A, 19A, 20A, 21A, 22A, 23A, 24A, 25A, 26A, 27A, 28A, and 37A are illustrated along reference cross-section A-A illustrated in FIG. 1, and FIGS. 18B, 19B, 20B, 21B, 22B, 23B, 24B, 25B, 25C, 26B, 27B, 28B, and 37B are illustrated along a similar cross-section B-B illustrated in FIG. 1, except for multiple fins/FinFETs. FIGS. 20C and 37C are illustrated along reference cross-section C-C illustrated in FIG. 1, except for multiple fins/FinFETs.

Figure 2:
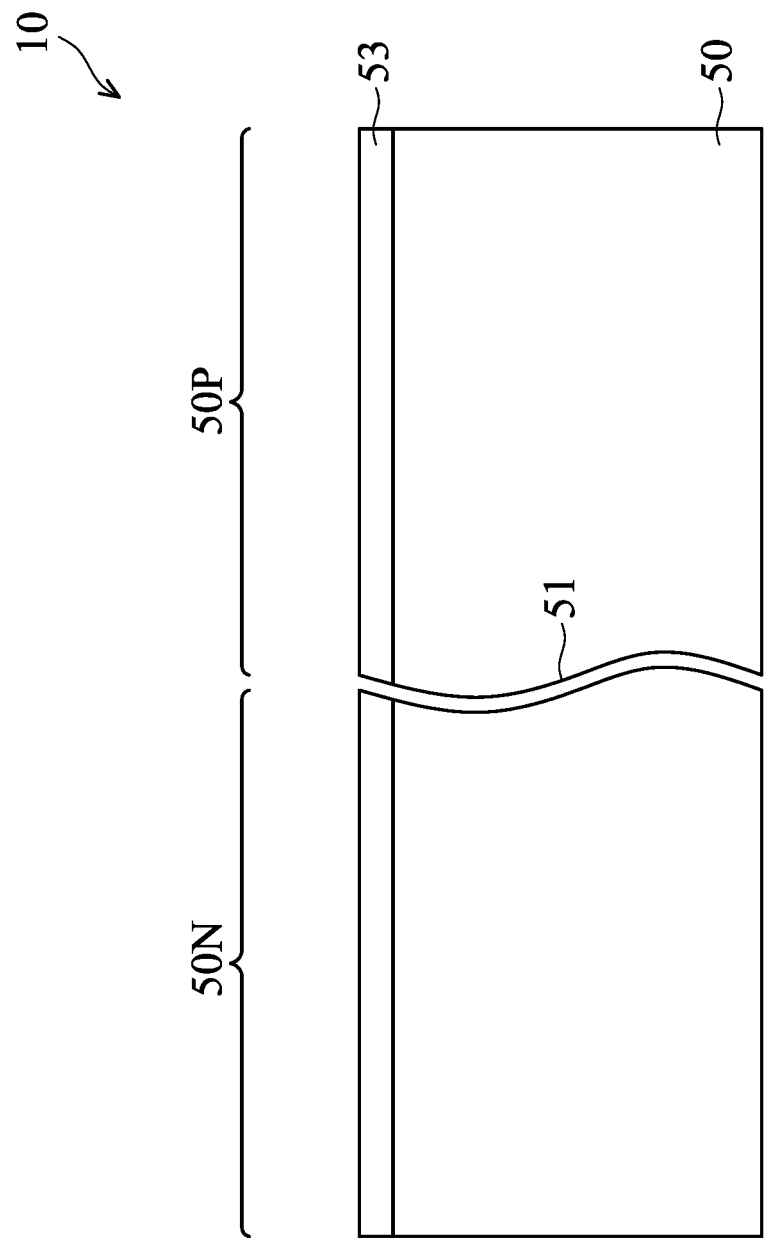
FIGS. 2, 3, 4, 5, 6, 7, 8, 9, 10, 11, 12, 13, 14, 15A, 15B, 15C, 15D, 15E, 15F, 15G, 15H, 16A, 16B, 17, 18A, 18B, 19A, 19B, 20A, 20B, 20C, 21A, 21B, 22A, 22B, 23A, 23B, 24A, 24B, 25A, 25B, 25C, 26A, 26B, 27A, 27B, 28A, and 28B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

A hard mask 53 is deposited on the substrate 50. The hard mask 53 may be used to define a pattern of subsequently formed semiconductor fins. In some embodiments, the hard mask is deposited using physical vapor deposition (PVD), chemical vapor deposition (CVD), atomic layer deposition (ALD), or the like. The hard mask 53 may comprise silicon oxide, silicon nitride, silicon oxynitride, a metal oxide, a metal nitride, multilayers thereof, or the like. For example, although only one hard mask layer is illustrated, a multilayer structure (e.g., a layer of silicon oxide on a layer of silicon nitride) may be formed as the hard mask 53.

FIGS. 3 through 28B illustrate various additional steps in the manufacturing of embodiment devices. FIGS. 3 through 28B illustrate features in either of the region 50N and the region 50P. For example, the structures illustrated in FIGS. 3 through 28B may be applicable to both the region 50N and the region 50P. Differences (if any) in the structures of the region 50N and the region 50P are described in the text accompanying each figure.

Figure 3:
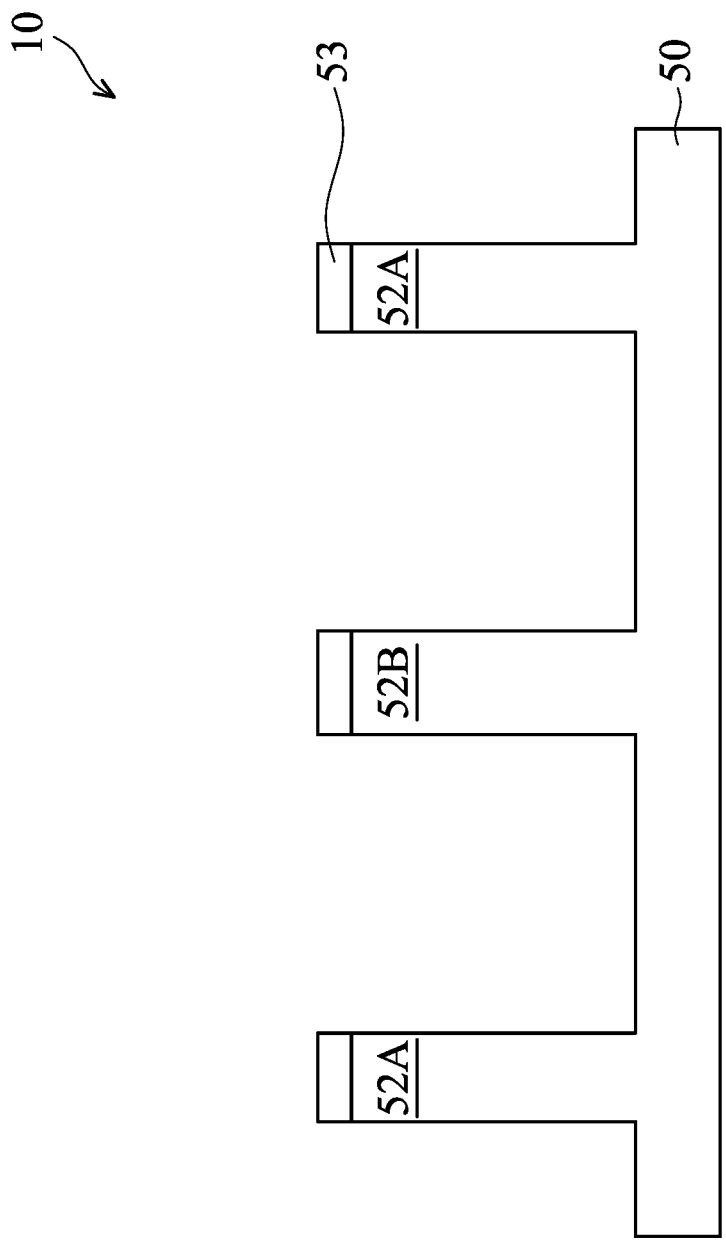

FIGS. 3 through 16B illustrate cross-sectional views (e.g., along cross-section A-A of FIG. 1) of manufacturing dummy fins according to various embodiments. In FIG. 3, fins 52A and 52B are formed in the substrate 50. The fins 52A/52B are semiconductor strips. The fins 52A/52B include a fin 52B between fins 52A. As will be described in subsequent figures, the fin 52B will be removed and replaced with a dummy fin 52' (see FIG. 14).

In some embodiments, the fins 52A may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52A/52B.

Figure 4:
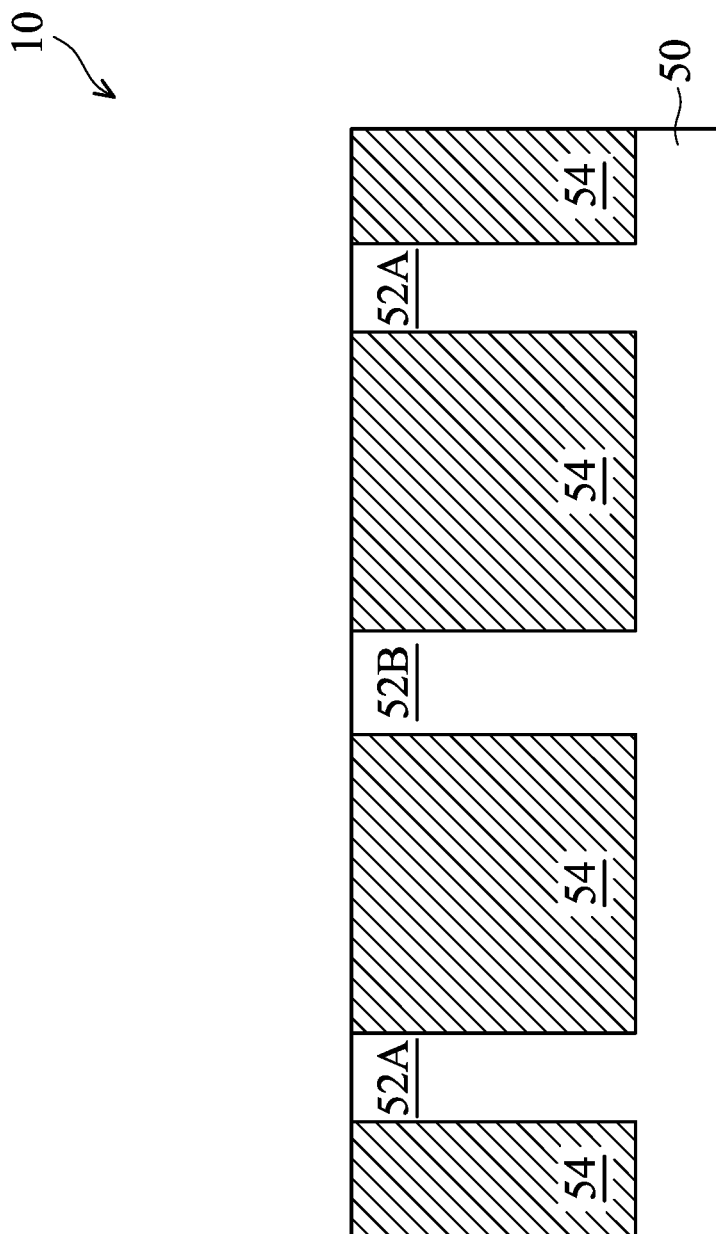

In FIG. 4, an insulation material 54 is formed over the substrate 50 and between neighboring fins 52A/52B. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52A/52B. Although the insulation material 54 is illustrated as a single layer, some embodiments may utilize multiple layers. For example, in some embodiments a conformal liner (not shown) may first be formed along a surface of the substrate 50 and the fins 52A/52B. Thereafter, a fill material, such as those discussed above may be formed over the liner.

After deposition, a removal process is applied to the insulation material 54 to remove excess insulation material 54 over the fins 52A/52B. In some embodiments, a planarization process such as a chemical mechanical polish (CMP), an etch-back process, combinations thereof, or the like may be utilized. The planarization process exposes the fins 52A/52B such that top surfaces of the fins 52A/52B and the insulation material 54 are level after the planarization process is complete. In embodiments in which mask 53 remains on the fins 52A/52B, the planarization process may expose the mask 53 or remove the mask 53 such that top surfaces of the mask or the fins 52A/52B, respectively, and the insulation material 54 are level after the planarization process is complete.

Figure 5:
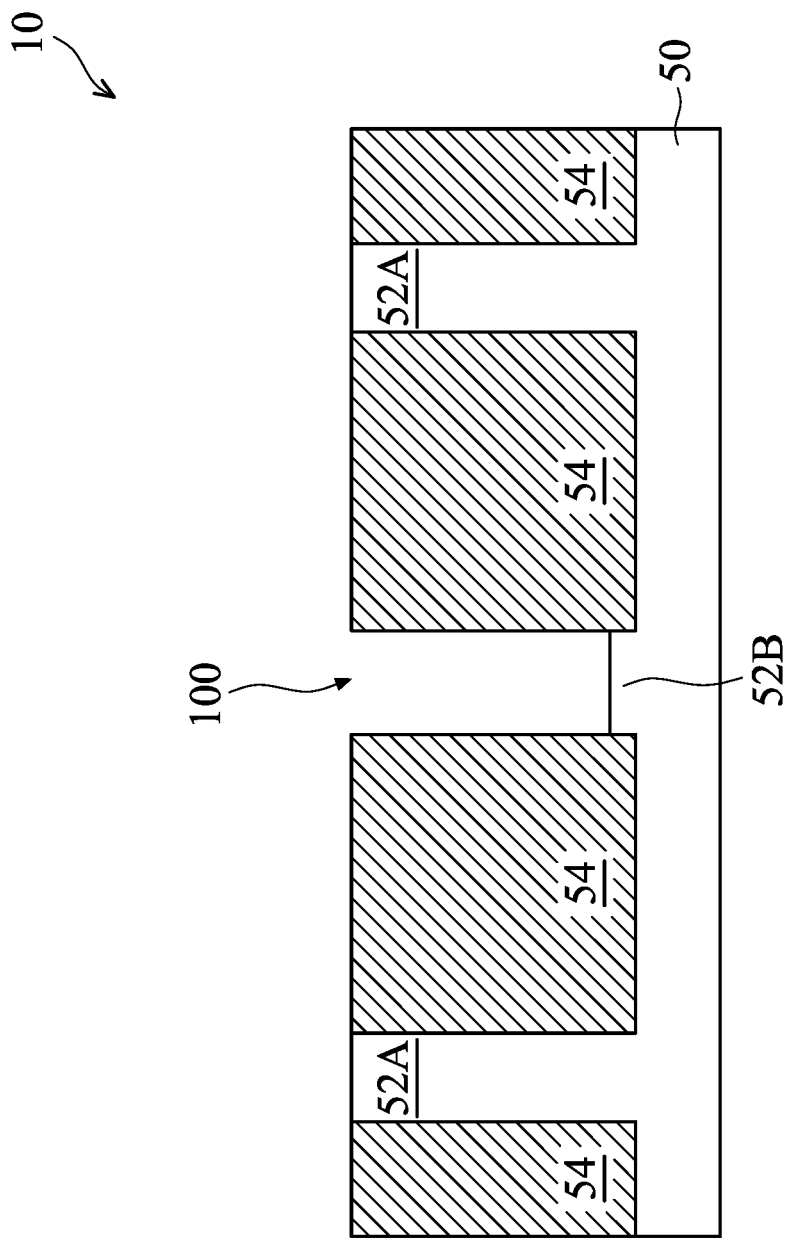

In FIG. 5, at least a portion of the fin 52B is removed using an acceptable etching process, for example. Thus, an opening 100 is formed in the isolation material 54 between the fins 52A. In subsequent processes, a dummy channel region may be formed in the opening 100. The fin 52B may be completely removed or a portion of the fin 52B may remain under the opening 100.

Figure 6:
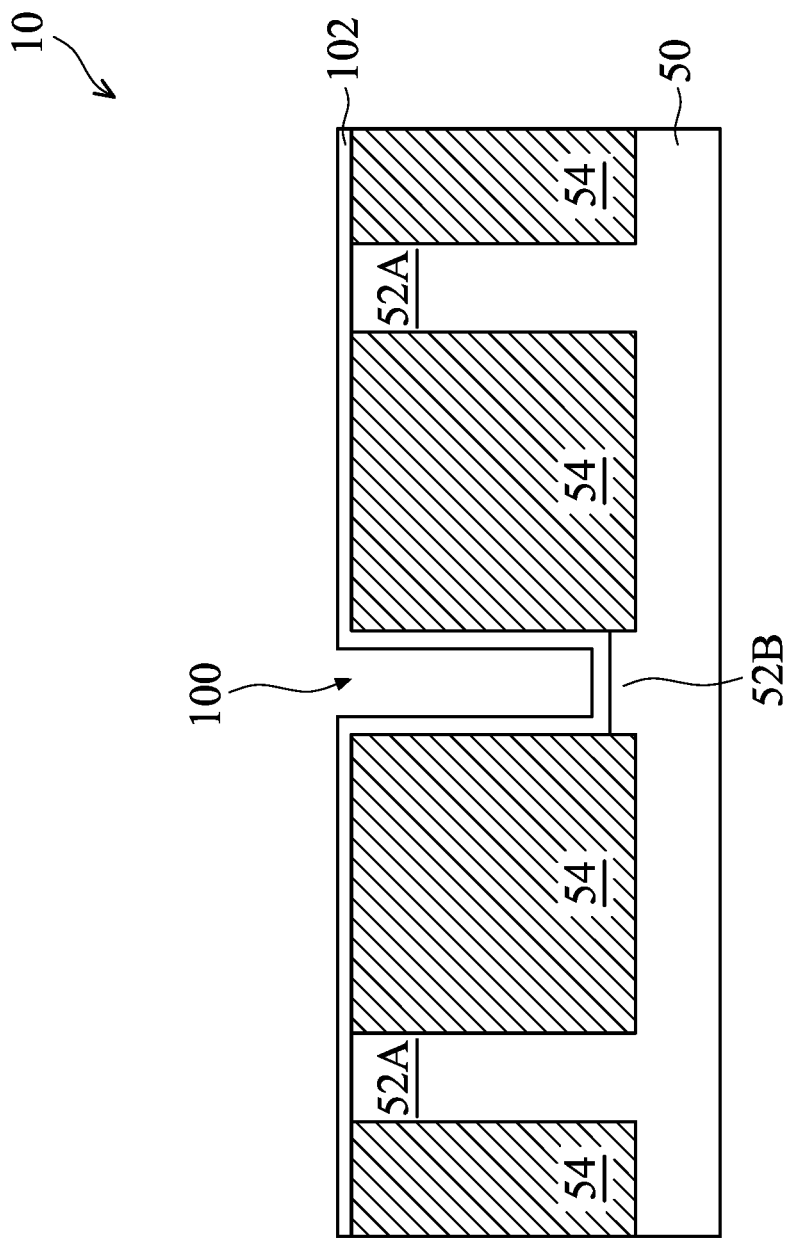

In FIG. 6, an optional spacer layer 102 is deposited over the isolation material 54 and the substrate 50. The spacer layer 102 may be deposited along sidewalls and a bottom surface of the recess 100. In embodiments where a portion of the fin 52B remains, the spacer layer 102 may be deposited over a top surface of the fin 52B. The spacer layer 102 may be deposited using any suitable process, such as, CVD, plasma enhanced CVD (PECVD), plasma enhanced ALD (PEALD), ALD, PVD, or the like. The spacer layer 102 may be deposited using a conformal process. A thickness of the spacer layer 102 may be in a range of about 3 Å to about 500 Å. The spacer layer 102 may comprise a silicon-based dielectric material (e.g., silicon nitride, silicon oxide, silicon oxynitride, silicon carbon oxynitride, silicon carbide, silicon oxycarbide, silicon oxide, or the like), a silicon based semiconductor material (e.g., silicon germanium), a metal oxide, a metal nitride, or the like. In embodiments, where the spacer layer 102 comprises a metal oxide or a metal nitride, the spacer layer 102 may comprise a metal, such as, hafnium, tantalum, aluminum, chromium, nickel, iron, yttrium, copper, tin, tungsten, or the like. The spacer layer 102 is an optional layer and may be omitted in other embodiments.

Figure 7:
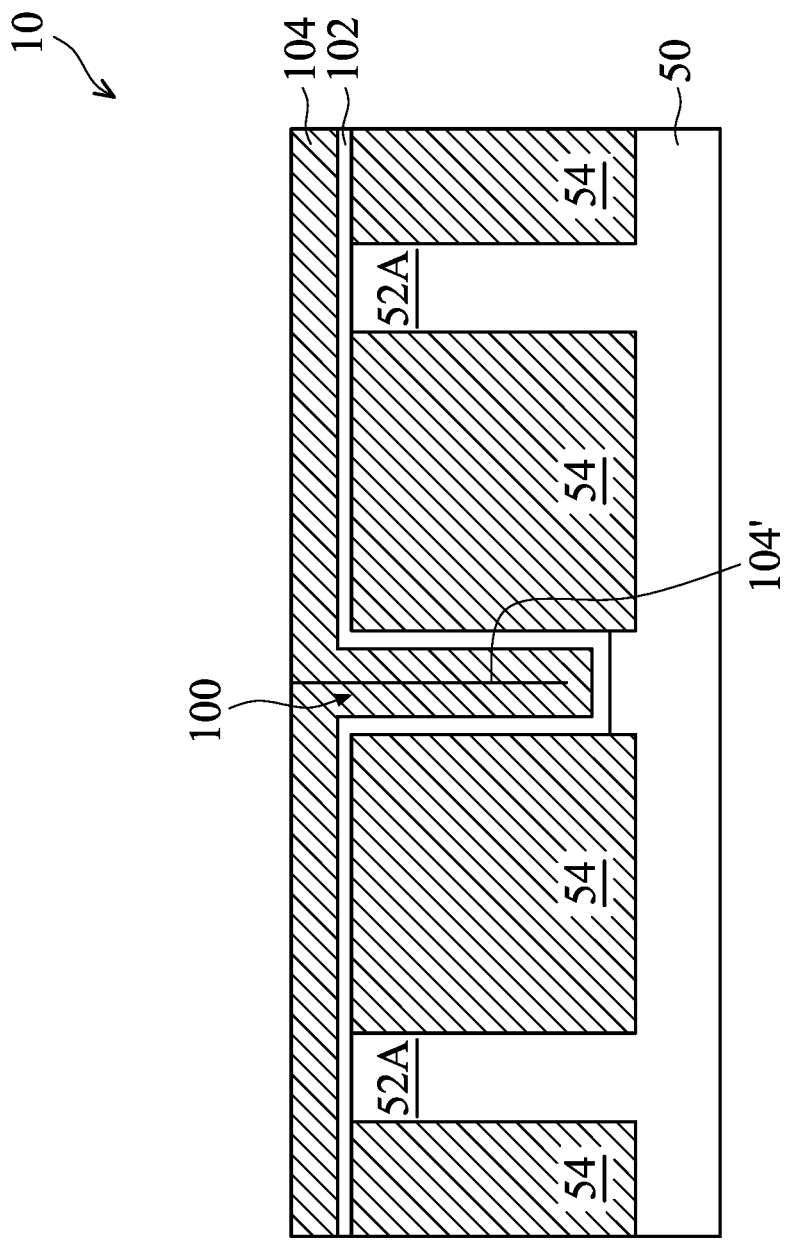

In FIG. 7, a film 104 is deposited over the spacer layer 102 (if present). Alternatively, in embodiments where the spacer layer 102 is omitted, the film 104 may be deposited directly on the isolation material 54 and the substrate 50. The film 104 may be deposited along sidewalls and a bottom surface of the recess 100 until portions of the film 104 on the sidewalls of the recess 100 are sufficiently thick and seam together. Thus, the film 104 may fill remaining portions of the recess 100, and a seam 104' may be formed in the film 104. The film 104 may be deposited using any suitable process, such as, CVD, PECVD, PEALD, ALD, PVD, or the like. The film 104 may be deposited using a conformal process. A thickness of the film 104 may be in a range of about 3 Å to about 500 Å. The film 104 may comprise a silicon-based dielectric material (e.g., silicon nitride, silicon oxide, silicon oxynitride, silicon carbon oxynitride, silicon carbide, silicon oxycarbide, silicon oxide, or the like), a silicon based semiconductor material (e.g., silicon germanium), a metal oxide, a metal nitride, or the like. In embodiments, where the film 104 comprises a metal oxide or a metal nitride, the film 104 may comprise a metal, such as, hafnium, tantalum, aluminum, chromium, nickel, iron, yttrium, copper, tin, tungsten, or the like.

A material of the film 104 may be the same or different than the spacer layer 102. Further, the spacer 102 may be included in embodiments to partially fill a portion of the recess 100 so that the film 104 may fill a remaining portion of the recess 100 with improved gap fill. For example, in embodiments where the recess 100 is relatively wide, multiple layers of material may be deposited in the recess 100 so that the layers collectively fill the recess 100 without requiring any individual layer to be excessively thick. Further, a material of the spacer 102 may be harder than the film 104. For example, a material of the film 104 may be selected for its gap filling characteristic, where the spacer 102 provides strength and structure support to the subsequently formed dummy fin 52' (see FIG. 14).

Figure 8:
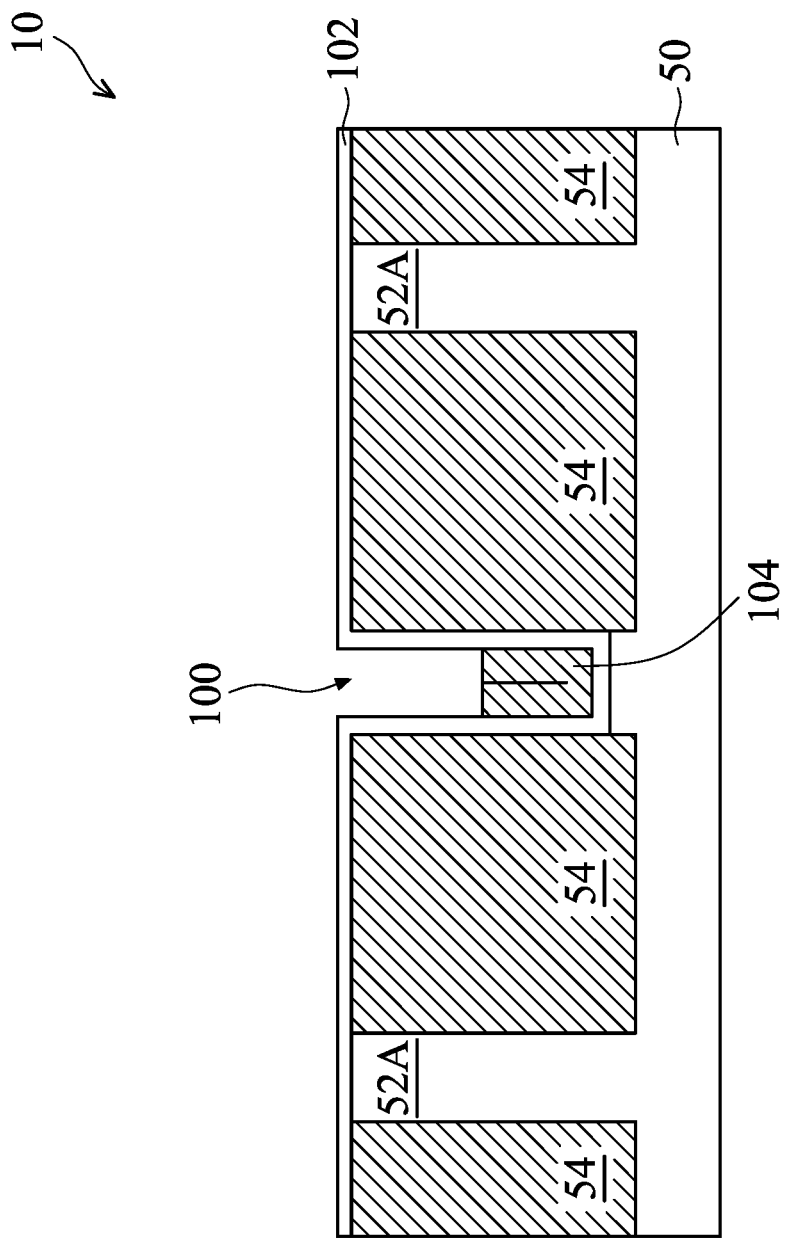

In FIG. 8, the film 104 may be etched back to a desired height. Etching the film 104 may comprise a selective process that selectively etches the film 104 without significantly etching the isolation material 54 or the fins 52A.

In some embodiments, the etch back process may be a plasma process, such as a plasma etch, a remote plasma process, a radical etch, or the like. An etching gas used during the plasma process may comprise $Cl_2$, HBr, $CF_4$, $CHF_3$, $CH_2F_2$, $CH_3F$, $C_4F_6$, $BCl_3$, $SF_6$, $H_2$, $NF_3$, combination thereof, or the like. The plasma process may further include flowing a passivation gas over the device 10 for tuning (e.g., increasing) etch selectivity between the film 104 and other features of the device 10. Embodiment passivation gases may comprise $N_2$, $O_2$, $CO_2$, $SO_2$, CO, $SiCl_4$, combinations thereof, or the like. One or more carrier gases may also be used during the plasma process, such as, Ar, He, Ne, combinations thereof, or the like. Further, the plasma process may be performed with a plasma source power in the range of about 10 W to about 3000 W, with a bias power in the range of about 0 W to about 3000 W, at a pressure of about 1 mTorr to about 800 mTorr, with a gas mixture flow rate of about 10 sccm to about 5000 sccm, or the like.

In some embodiments, the etch back process is a wet etch process (sometimes referred to as a wet clean). Embodiment etchants that may be used during the wet etch process may include HF, $F_2$, combinations thereof, or the like. The wet etch process may further include flowing an assisted etch chemical over the device 10 for tuning (e.g., increasing) etch selectivity between the film 104 and other features of the device 10. Embodiment assisted etch chemicals may comprise $H_2SO_4$, HCl, HBr, $NH_3$, combinations thereof, or the like. Deionized water (DIW), alcohol, acetone, or the like may be used as a solvent for mixing the etchant and/or the assisted etch chemical during the wet etch process.

Figure 9:
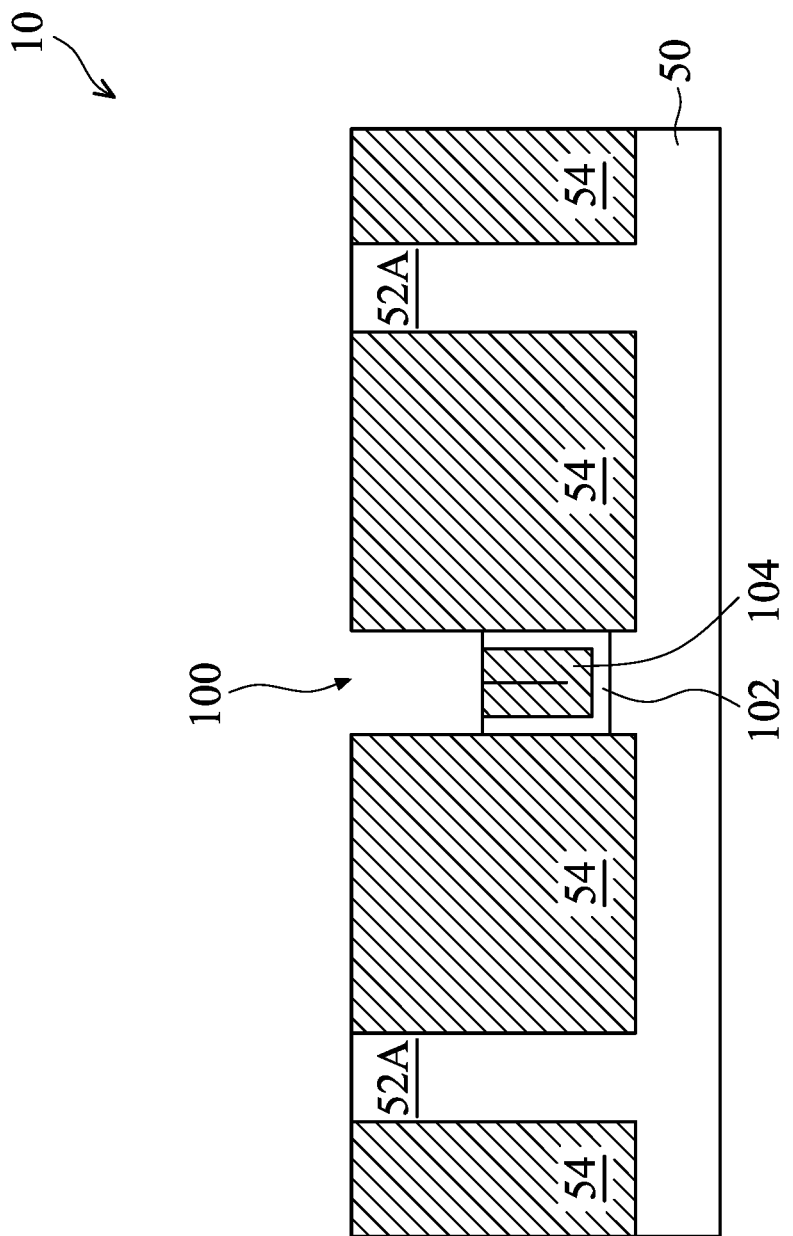

In FIG. 9, the spacer layer 102 is etched back, for example, to a same level as the film 104. Etching the spacer layer 102 may comprise a selective process that selectively etches the spacer layer 102 without significantly etching the isolation material 54 or the fins 52A. The etch back process for the spacer layer 102 may be the same or different than the film 104.

In some embodiments, the etch back process for the spacer layer 102 may be a plasma process, such as a plasma etch, a remote plasma process, a radical etch, or the like. An etching gas used during the plasma process may comprise $Cl_2$, HBr, $CF_4$, $CHF_3$, $CH_2F_2$, $CH_3F$, $C_4F_6$, $BCl_3$, $SF_6$, Hz, $NF_3$, combination thereof, or the like. The plasma process may further include flowing a passivation gas over the device 10 for tuning (e.g., increasing) etch selectivity between the film 104 and other features of the device 10. Embodiment passivation gases may comprise $N_2$, $O_2$, $CO_2$, $SO_2$, CO, $SiCl_4$, combinations thereof, or the like. One or more carrier gases may also be used during the plasma process, such as, Ar, He, Ne, combinations thereof, or the like. Further, the plasma process may be performed with a plasma source power in the range of about 10 W to about 3000 W, with a bias power in the range of about 0 W to about 3000 W, at a pressure of about 1 mTorr to about 800 mTorr, with a gas mixture flow rate of about 10 sccm to about 5000 sccm, or the like.

In some embodiments, the etch back process for the spacer layer 102 is a wet etch process (sometimes referred to as a wet clean). Embodiment etchants that may be used during the wet etch process may include HF, $F_2$, combinations thereof, or the like. The wet etch process may further include flowing an assisted etch chemical over the device 10 for tuning (e.g., increasing) etch selectivity between the film 104 and other features of the device 10. Embodiment assisted etch chemicals may comprise $H_2SO_4$, HCl, HBr, $NH_3$, combinations thereof, or the like. Deionized water (DIW), alcohol, acetone, or the like may be used as a solvent for mixing the etchant and/or the assisted etch chemical during the wet etch process.

Figure 10:
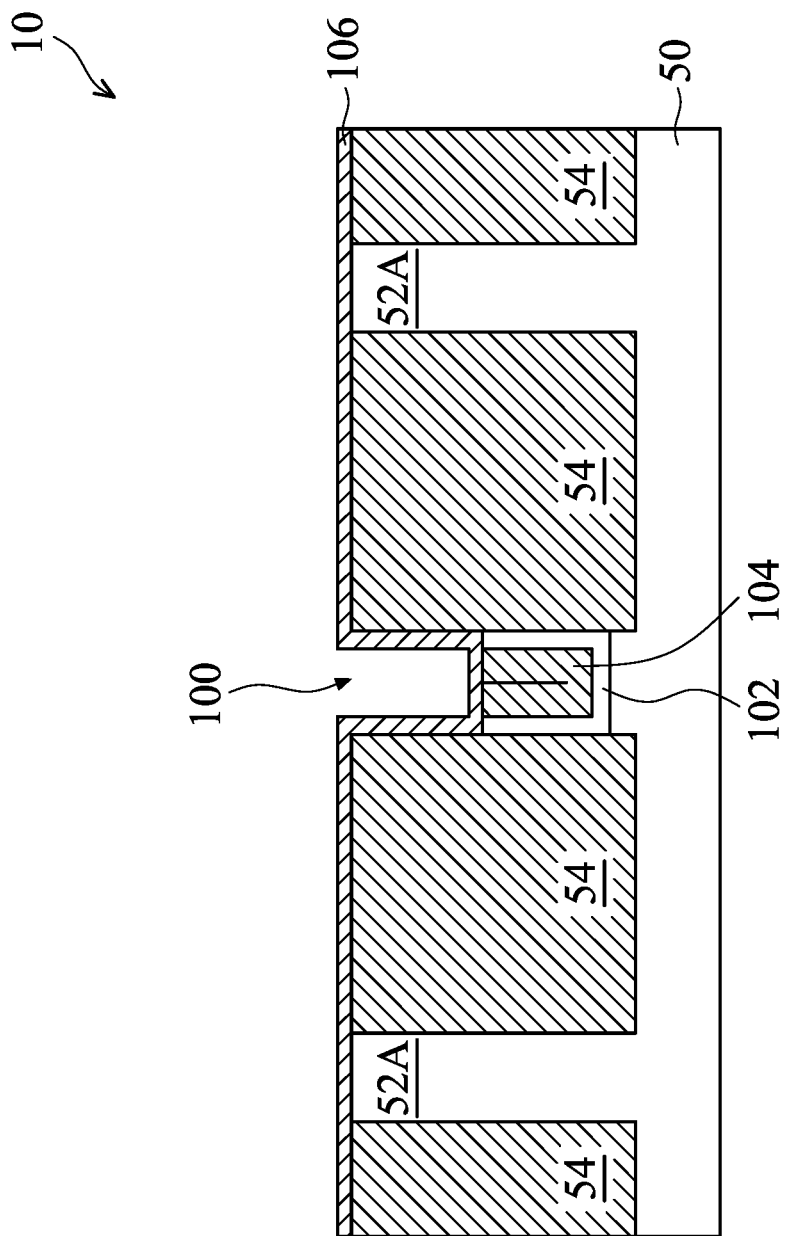

In FIG. 10, a film 106 is deposited over the fins 52A, the isolation material 54, the film 104, and the spacer layer 102 (if present). The film 106 may be deposited along sidewalls and a bottom surface of the recess 100. The film 106 may be deposited using any suitable process, such as, CVD, PECVD, PEALD, ALD, PVD, or the like. The film 106 may be deposited using a conformal process. Although one layer of film 106 is illustrated, the film 106 may be a multi-layered structure. For example, in some embodiments, the film 106 may comprise up to ten layers of different materials. Each layer of the film 106 may be deposited using a similar process described above. A thickness of each layer in the film 106 may be in a range of about 3 Å to about 500 Å.

Each layer of the film 106 may comprise a silicon-based dielectric material (e.g., silicon nitride, silicon oxide, silicon oxynitride, silicon carbon oxynitride, silicon carbide, silicon oxycarbide, silicon oxide, or the like), a silicon based semiconductor material (e.g., silicon germanium), a metal oxide, a metal nitride, or the like. In embodiments, where the film 106 comprises a metal oxide or a metal nitride, the film 106 may comprise a metal, such as, hafnium, tantalum, aluminum, chromium, nickel, iron, yttrium, copper, tin, tungsten, or the like. A material of each layer of the film 106 may be selected to provide etch selectivity in one or more subsequent processes. For example, a material of the film 106 may be selected so that it can be etched away to provide a dummy channel region with a thinner top/middle portion.

Figure 11:
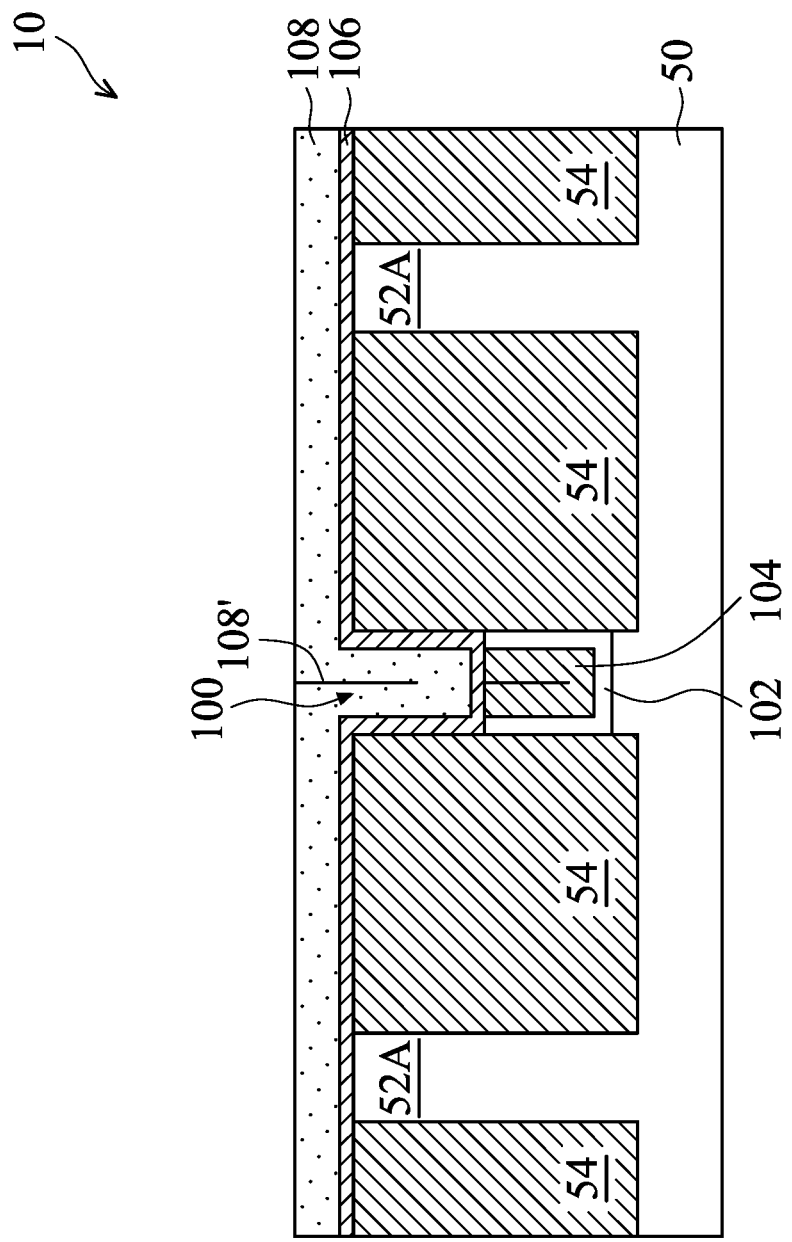

In FIG. 11, a film 108 is deposited over the film 106. The film 108 may be deposited along sidewalls and a bottom surface of the recess 100 until portions of the film 108 on the sidewalls of the recess 100 are sufficiently thick and seam together. Thus, the film 108 may fill remaining portions of the recess 100, and a seam 108' may be formed in the film 108. The film 108 may be deposited using any suitable process, such as, CVD, PECVD, PEALD, ALD, PVD, or the like. The film 108 may be deposited using a conformal process. A thickness of the film 108 may be in a range of about 3 Å to about 500 Å. The film 108 may comprise a silicon-based dielectric material (e.g., silicon nitride, silicon oxide, silicon oxynitride, silicon carbon oxynitride, silicon carbide, silicon oxycarbide, silicon oxide, or the like), a silicon based semiconductor material (e.g., silicon germanium), a metal oxide, a metal nitride, or the like. In embodiments, where the film 108 comprises a metal oxide or a metal nitride, the film 108 may comprise a metal, such as, hafnium, tantalum, aluminum, chromium, nickel, iron, yttrium, copper, tin, tungsten, or the like.

Materials of the films 106 and 108 may be selected so that the film 106 can be etch selectively without significantly etching the film 108 in subsequent processes. Further, the material of the film 108 may also be selected so that it is not significantly etched during source/drain formation steps of the FinFETs. As will be described in greater detail subsequently, forming source/drain regions may comprise etching gate spacer layers to expose the fins 52A and then etching the fins 52A. Exposing the fins 52A may also expose the film 108. Thus, the material of the film 108 may be selected so that it is not significantly etched during gate spacer and fin 52' etching. For example, a nitrogen concentration of the film 108 may be relatively low to provide etch selectivity during gate spacer etching in embodiments where the gate spacer comprises a nitride. In some embodiments, a nitrogen concentration of the film 108 may be less than 40 at. %, and the film 108 may be an oxide or an oxynitride, for example. As another example, the film 108 may be a different material than the fins 52A to provide etch selectivity during fin patterning. For example, the fins 52A may comprise germanium. In still other embodiments, the film 108 may comprise a high-k material to provide etch selectivity during both gate spacer patterning and fin patterning.

In some embodiments, a material of the film 108 may have a higher chemical bond energy than a material of the film 104 and/or the spacer 102. As a result, it may be difficult to etch the film 108 and reduce a width of the film 108 directly. Accordingly, a lower bond energy film 106 is formed on the film 108, and the film 106 is trimmed in subsequent processing steps. This trimming advantageously increases a space between the fins 52' for improved gap filling in subsequent process steps.

Figure 12:
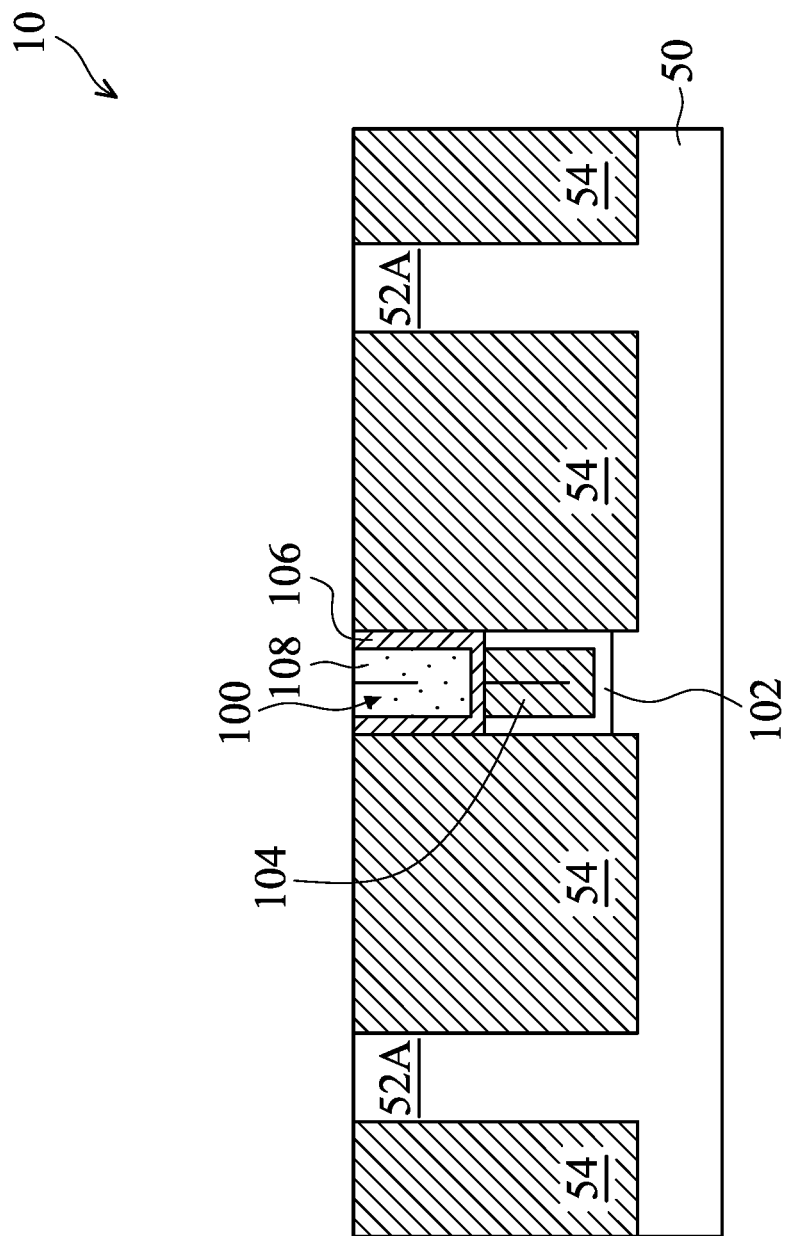

In FIG. 12, a removal process is applied to the films 106 and 108 to remove excess material of the films 106 and 108 over the fins 52A/52B. In some embodiments, a planarization process such as a chemical mechanical polish (CMP), an etch-back process, combinations thereof, or the like may be utilized. The planarization process exposes the fins 52A and the insulation material 54 such that top surfaces of the fins 52A, the insulation material 54, the film 106, and the film 108 are level after the planarization process is complete.

Figure 15C:
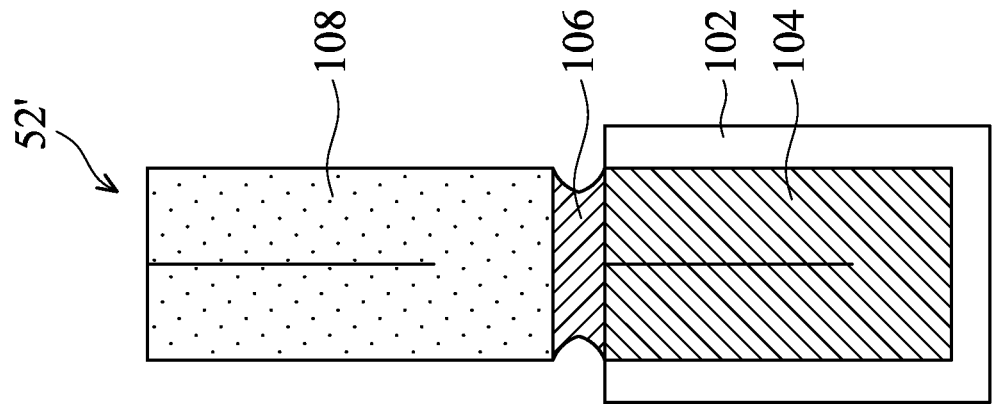
Figure 15B:
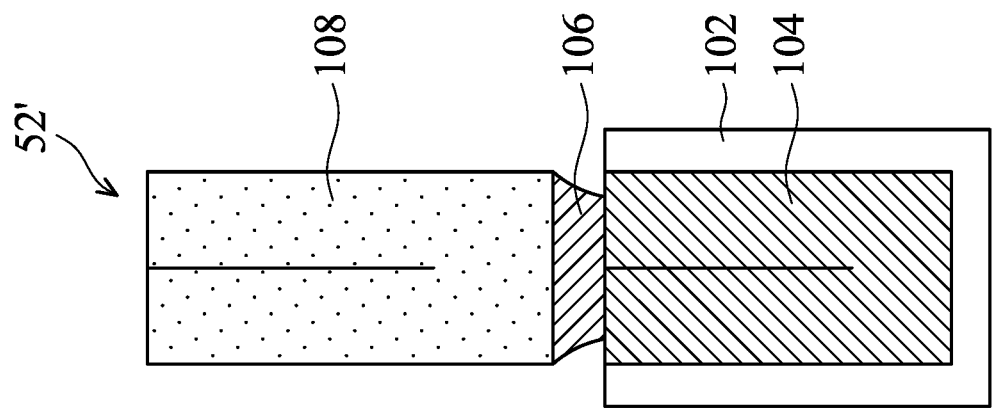
Figure 15A:
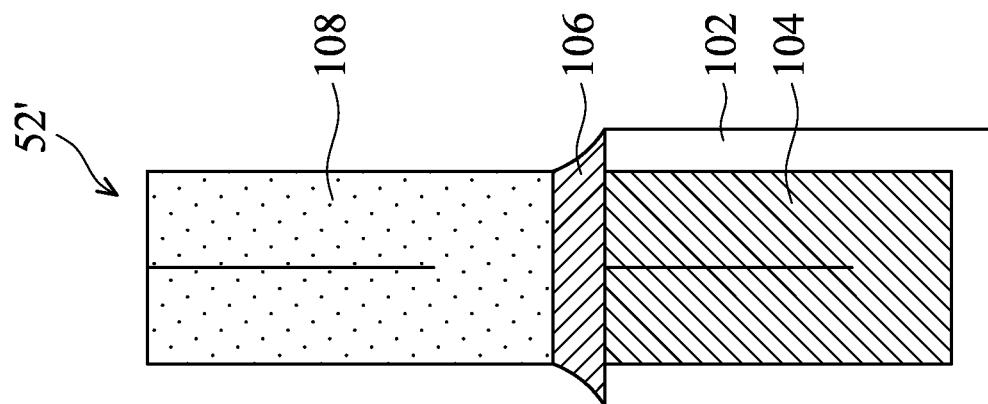

Although film 108 is illustrated as only a single material, the film 108 may have a multilayered structure. For example, the film 108 may comprise multiple, stacked films in other embodiments. In such embodiments, each film layer may be deposited as described above with respect to FIG. 11 and recessed in a similar manner as discussed above with respect to recessing film 104 (see FIG. 8). This process may be repeated until a desired number of layers is formed for the film 108. In some embodiments, up to ten film layers may be deposited and etched back in the recess 100 over the film 106. An example where the film 108 has multiple layers is illustrated in FIGS. 15G and 15H.

Figure 13:
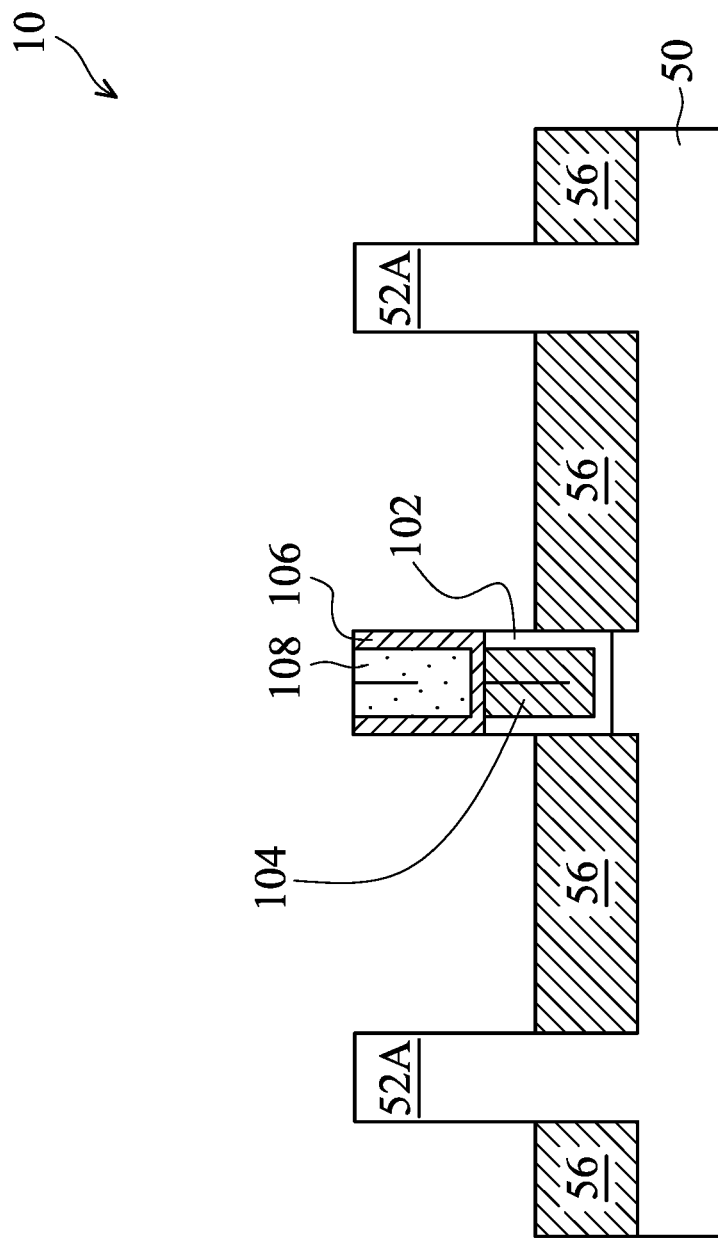

In FIG. 13, the insulation material 54 is recessed to form Shallow Trench Isolation (STI) regions 56. The insulation material 54 is recessed such that upper portions of fins 52A protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used. Recessing the insulation material 54 may use a process that is selectively etches the insulation material 54 compared to the films 106/108 and/or the spacer layer 102.

The process described with respect to FIGS. 2 through 13 is just one example of how the fins 52A may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52A. For example, the fins 52A in FIG. 13 can be recessed, and a material different from the fins 52A may be epitaxially grown over the recessed fins 52A. In such embodiments, the fins 52A comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52A. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). It may also be advantageous to epitaxial grow a material in a first circuit region (e.g., SRAM) of the device 10 different from a material in a second circuit region of the device 10 regardless of the type of device (e.g., NMOS or PMOS) in the first circuit region or the second circuit region. In various embodiments, upper portions of the fins 52A may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 13, appropriate wells (not shown) may be formed in the fins 52A and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52A and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52A and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 14:
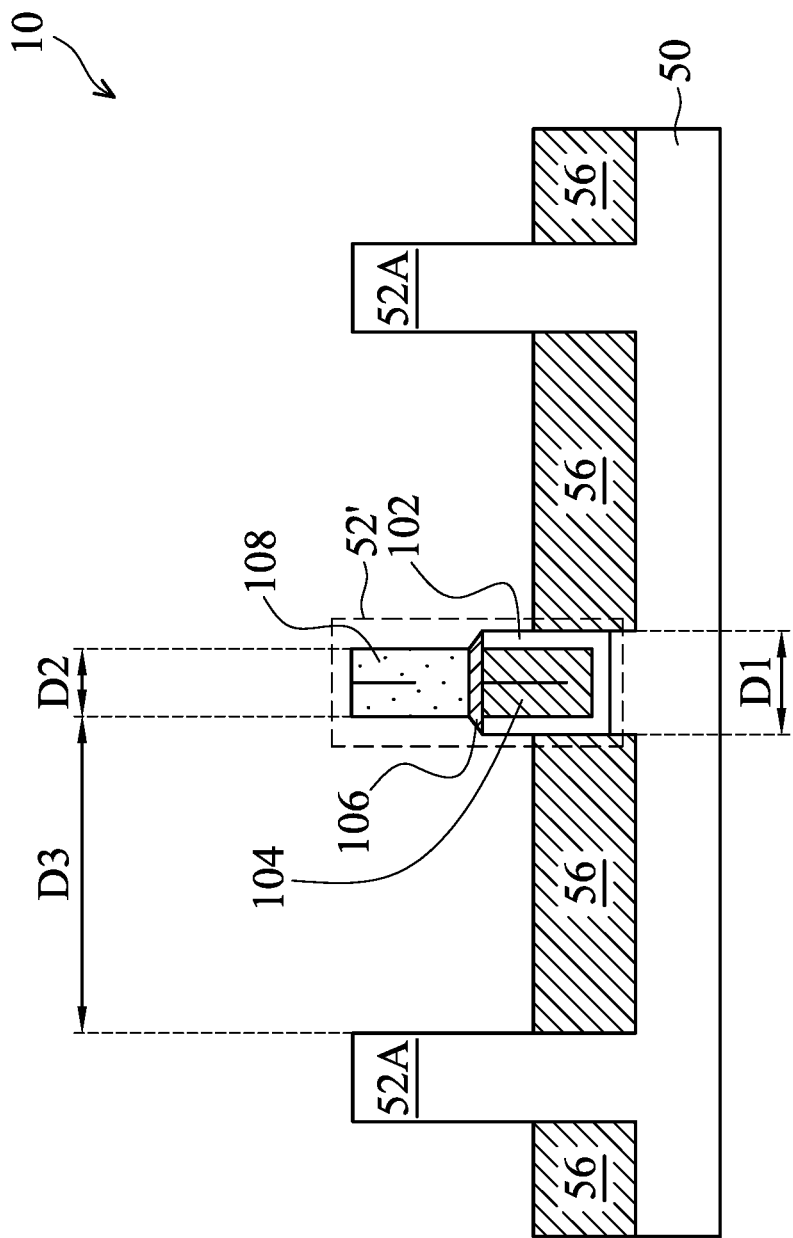

In FIG. 14, the film 106 is etched and at least partially removed from sidewalls of the film 108. Etching the film 106 may comprise a selective process that selectively etches the film 106 without significantly etching the film 108, the spacer layer 102, or the film 104.

In some embodiments, etching the film 106 may comprise a plasma process, such as a plasma etch, a remote plasma process, a radical etch, or the like. An etching gas used during the plasma process may comprise $Cl_2$, HBr, $CF_4$, $CHF_3$, $CH_2F_2$, $CH_3F$, $C_4F_6$, $BCl_3$, $SF_6$, Hz, $NF_3$, combination thereof, or the like. The plasma process may further include flowing a passivation gas over the device 10 for tuning (e.g., increasing) etch selectivity between the film 106 and other features of the device 10. Embodiment passivation gases may comprise $N_2$, $O_2$, $CO_2$, $SO_2$, CO, $SiCl_4$, combinations thereof, or the like. One or more carrier gases may also be used during the plasma process, such as, Ar, He, Ne, combinations thereof, or the like. Further, the plasma process may be performed with a plasma source power in the range of about 10 W to about 3000 W, with a bias power in the range of about 0 W to about 3000 W, at a pressure of about 1 mTorr to about 800 mTorr, with a gas mixture flow rate of about 10 sccm to about 5000 sccm, or the like.

In some embodiments, etching the film 106 may comprise a wet etch process (sometimes referred to as a wet clean). Embodiment etchants that may be used during the wet etch process may include HF, $F_2$, combinations thereof, or the like. The wet etch process may further include flowing an assisted etch chemical over the device 10 for tuning (e.g., increasing) etch selectivity between the film 106 and other features of the device 10. Embodiment assisted etch chemicals may comprise $H_2SO_4$, HCl, HBr, $NH_3$, combinations thereof, or the like. Deionized water (DIW), alcohol, acetone, or the like may be used as a solvent for mixing the etchant and/or the assisted etch chemical during the wet etch process.

The film 106 may mask the film 104 during etching so that the film 104 is not inadvertently etched. Etching the film 104 may lead to deleterious results. For example, significantly reducing a width of the film 104 may impact the structural stability of the dummy fin 52'. Accordingly, in some embodiments, the film 106 is trimmed while masking the film 104 so that the stability of the dummy fin 52' is not significantly affected.

Thus, a dummy fin 52' is formed. The dummy fin 52' comprises the spacer layer 102, the film 104, remaining portions of the film 106, and the film 108. As a result of etching the film 106, a middle portion of the dummy fin 52' (e.g., comprising the films 106 and 108) has a width D2. The width D2 may be less than a width D1 of a lower portion (e.g., comprising the spacer layer 102 and the film 104) of the dummy fin 52'. The width D1 may be measured at a level of the film 104, and the width D2 may be measured at a level of the film 108. For example, the width D1 may be in a range of about 2 nm to about 1000 nm, and the width D2 may be in a range of about 2 nm to about 1000 nm. The widths D1 and D2 may depend on the location of a particular dummy fin 52'. For example, in a first area, the width D1 may be in a range of about 8 nm to about 14 nm, and the width D2 may be in a range of about 4 nm to about 10 nm. In a second area, the widths D1 and D2 may be about 100 nm or more. By providing a smaller width D2 than width D1 (e.g., in the above ranges), a distance D3 of the space between the fins 52A and the dummy fin 52' can be increased. For example, the space between the fin 52A and the dummy fin 52' can be enlarged, which improves a process window for filling the space between the fins 52A and dummy fin 52' in subsequent steps (e.g., dummy gate fill or metal gate fill). Further, a base of the dummy fin 52' is not reduced, which improves structure stability of the dummy fin 52' particularly in subsequent processing steps where areas of the dummy fin 52' may be exposed to one or more etchants. Accordingly, manufacturing defects (e.g., voids) can be reduced in subsequent deposition processes.

FIG. 14 illustrates an embodiment configuration of the dummy fin 52'. In other embodiments, the dummy fin 52' may have a different configuration. For example, FIG. 15A illustrate a detailed view of the dummy fin 52' as illustrated in FIG. 14. FIGS. 15B through 15H illustrate alternative embodiments of the fin 52', each of which may be deployed in the structure of FIG. 14.

In FIG. 15A, a top surface of the film 106 (e.g., surface adjoining the film 108) is less wide than a bottom surface of the film 106 (e.g., surface adjoining the film 104). In other embodiments, as illustrated by FIG. 15B, the top surface of the film 106 may be wider than the bottom surface of the film 106. In still other embodiments, as illustrated by FIG. 15C, a middle portion of the film 106 may be less wide than top and bottom surfaces of the film 106, and the film 106 has concave sidewalls. In such embodiments, widths of the top and bottom surfaces of the film 106 may be the same or different.

Further, in FIG. 15A, the film 106 is illustrated as being completely removed from sidewalls of the film 108. In other embodiments, a portion the film 106 may remain on sidewalls of the film 108. For example, as illustrated by FIG. 15D, the film 106 remain on sidewalls of and extend to a top surface of the film 108. As another example, as illustrated by FIG. 15E, the film 106 may partially extend up sidewalls of the film 108 such that the film 108 extends higher than the film 106. In the embodiments of FIGS. 15D and 15E, a maximum thickness T1 of the film 106 on sidewalls of the film 108 may be less than a thickness T2 of the film 106 on a bottom surface of the film 108. In some embodiments, the thickness T2 of the film 106 on the bottom surface of the film 108 may be in the range of about 2 Å to about 100 Å. Further, an overall height T3 of the film 106 may be in a range to about 3 Å to about 1000 Å. The height T3 may be measured from a bottommost surface of the film 106 to a topmost point of the film 106.

Figure 15F:
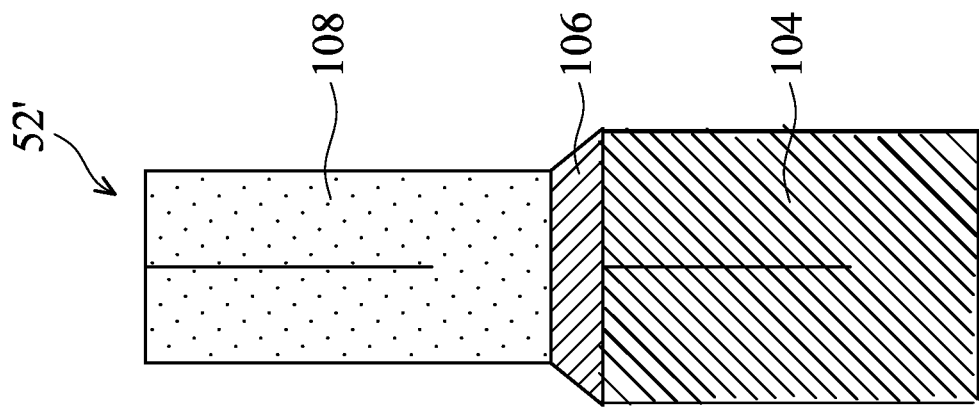
Figure 15E:
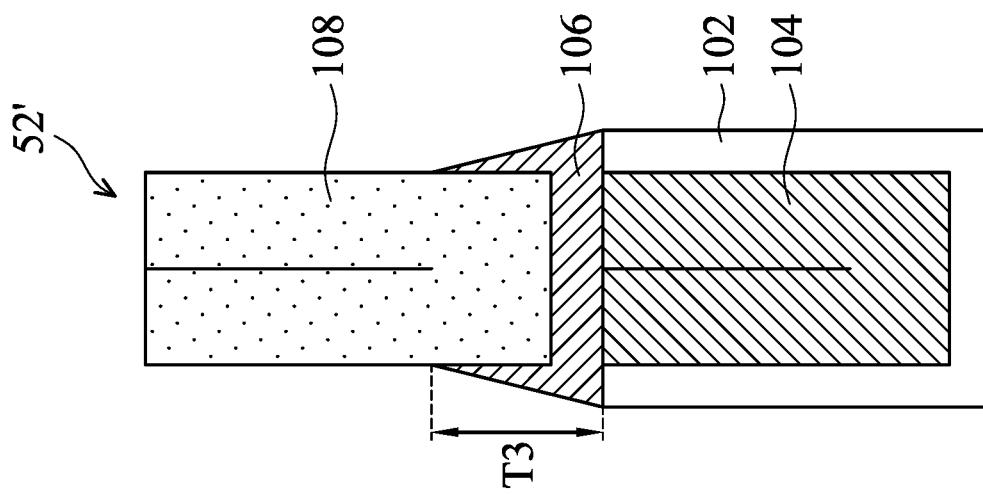
Figure 15D:
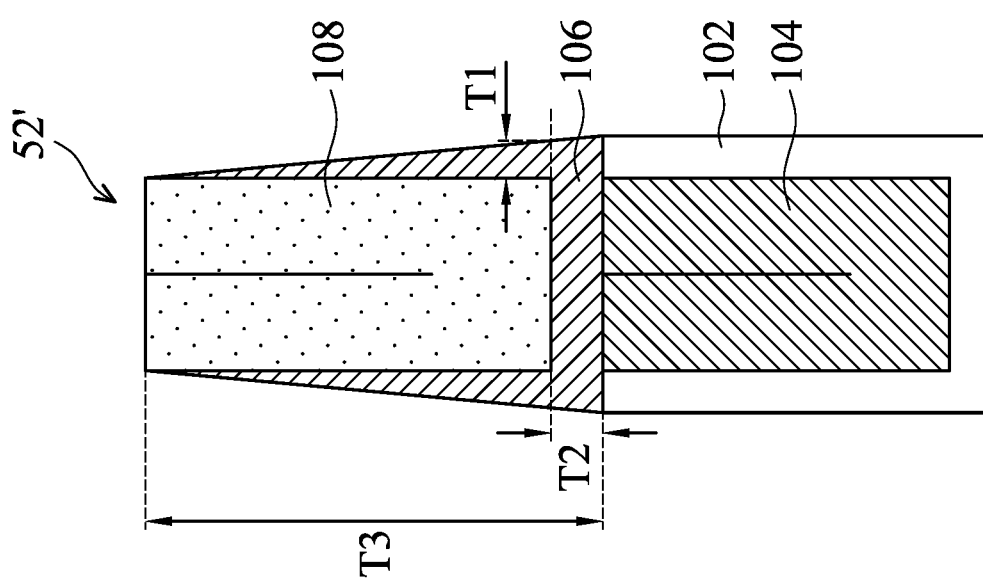
Figure 15H:
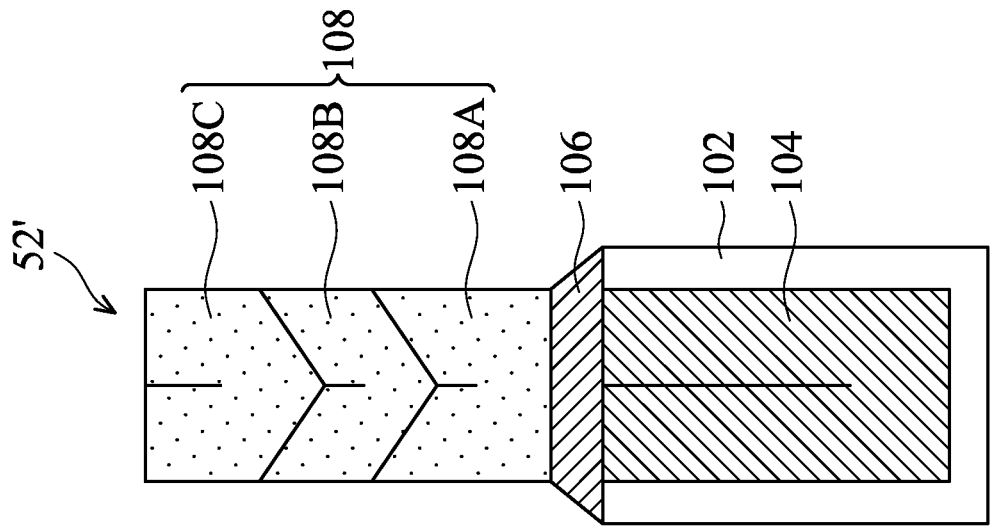
Figure 15G:
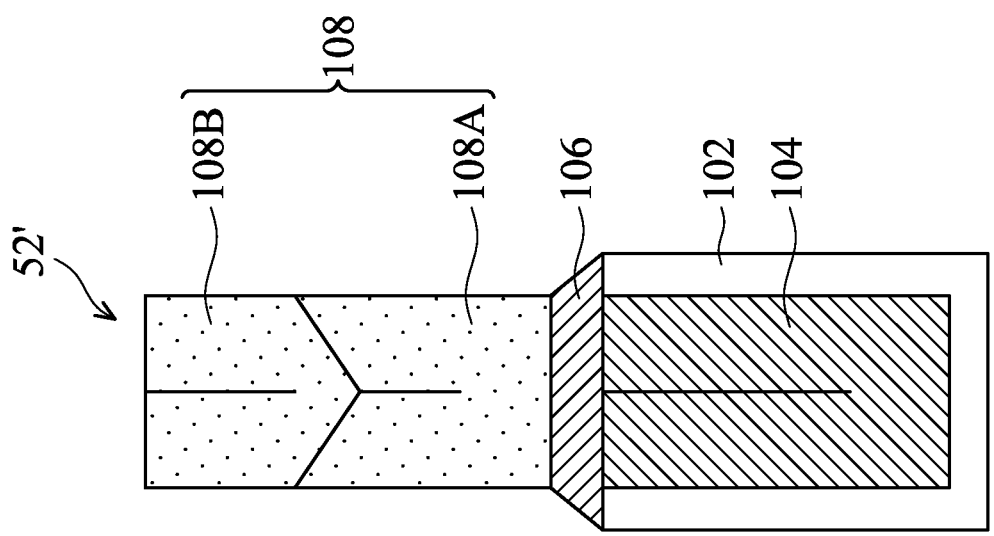

FIG. 15F illustrates an embodiment where the optional spacer layer is omitted. In such embodiments, the film 104 may be in direct contact with the STI regions 56 and the substrate 50/remaining portions of the fin 52A (See FIG. 14). Although FIG. 15F illustrates the film 106 having a same configuration as FIG. 15A, it should be understood that any configuration of film 106 (e.g., as illustrated by FIGS. 15B-15E) may be used instead.

FIGS. 15G and 15H illustrate embodiments where the film 108 is a multilayered structure. In FIG. 15G, the film 108 comprises a film layer 108A, and a film layer 108B on a top surface of the film layer 108A. In FIG. 15H, the film 108 comprises a film layer 108A, a film layer 108B on a top surface of the film layer 108A, and a film layer 108C on a top surface of the film layer 108B. Each of the film layers 108A, 108B, and 108C may be deposited and optionally recessed as described above. Each of the film layers 108A, 108B, and 108C may have a different material composition than an adjacent film layer. Further, as a result of etch back process(es) to recess one or more of the film layers (e.g., film layers 108A/108B), a top surface of these etched film layers may have a V-shape in some embodiments. Although FIGS. 15G and 15H illustrate the film 106 having a same configuration as FIG. 15A, it should be understood that any configuration of film 106 (e.g., as illustrated by FIGS. 15B-15E) may be used instead. Further, in FIGS. 15G and 15H, the spacer layer 102 is optional and may be excluded as described above with respect to FIG. 15F.

Figure 16A:
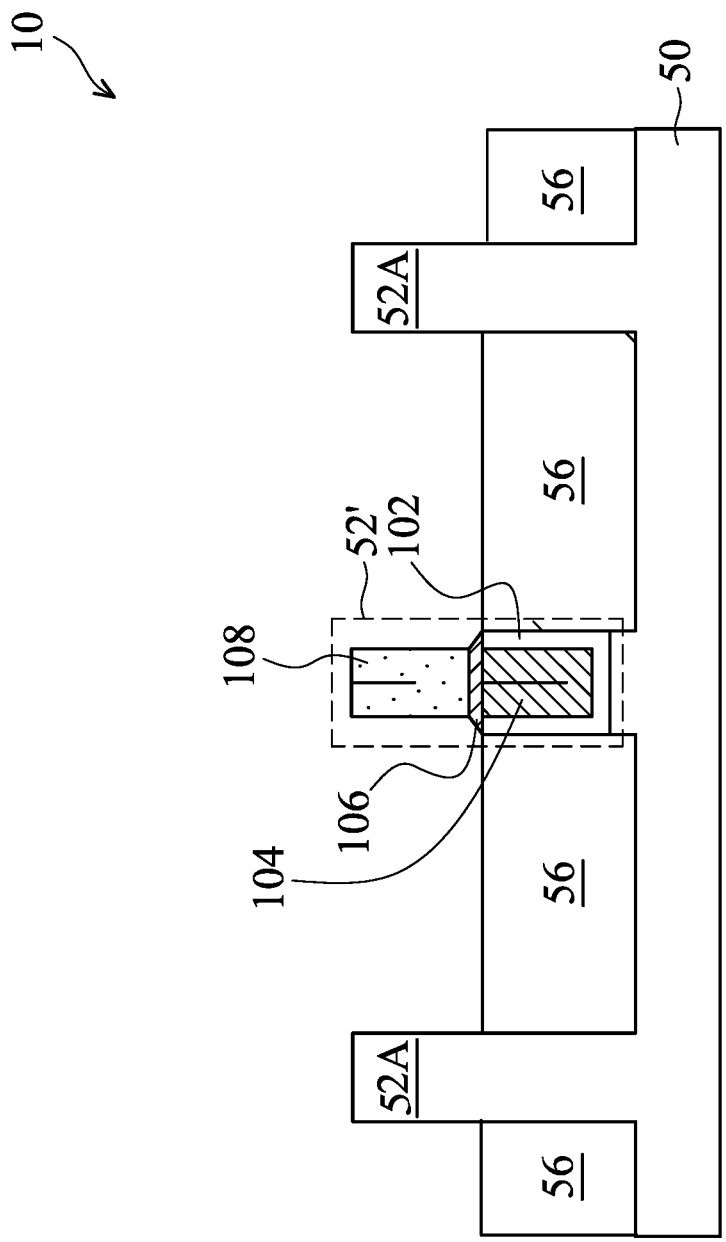
Figure 16B:
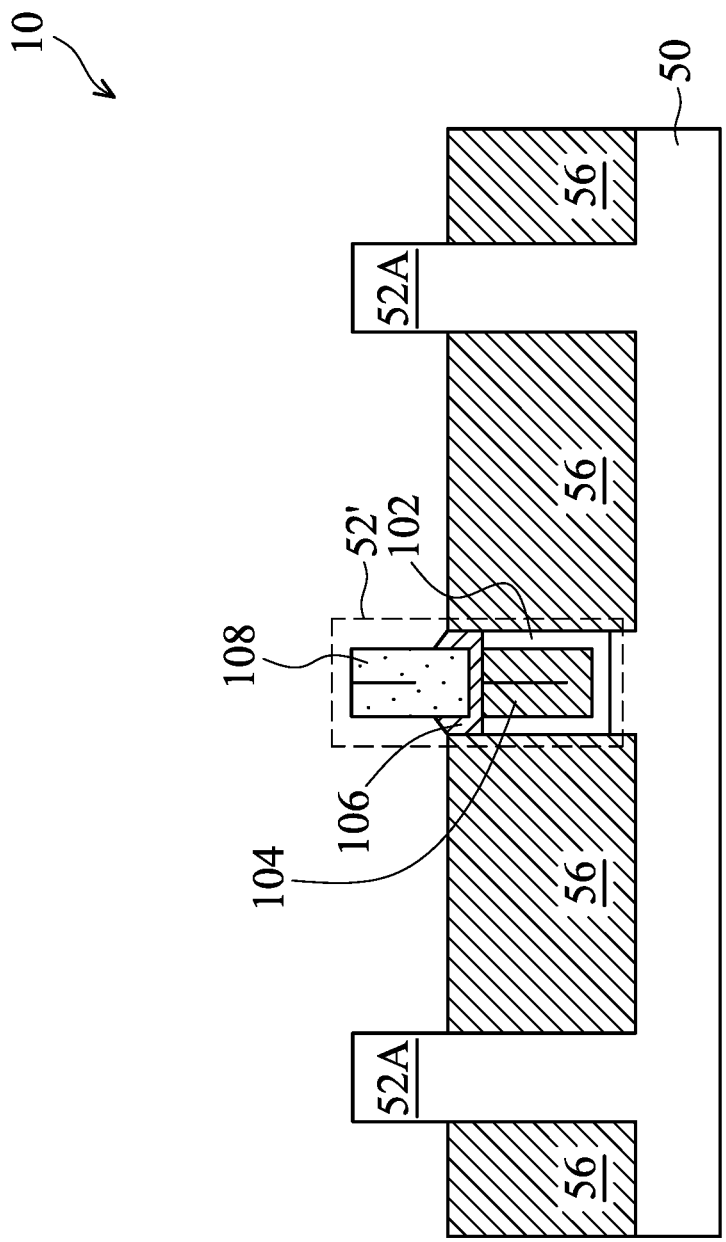

In the embodiment of FIG. 14, the STI regions 56 are illustrated as having top surfaces lower than the films 106/108. For example, the spacer layer 102, the film 104, the film 106, and the films 108 each extend higher than the STI regions 56. In other embodiments, the STI regions 56 may be disposed at a different level. For example, FIG. 16A illustrates an embodiment where the top surface of the STI regions 56 is substantially level (e.g., within manufacturing tolerances) with a bottom surface of the film 106 and substantially level with top surfaces of the spacer layer 102 and the film 104. FIG. 16B illustrates an embodiment, where the top surfaces of the STI regions 56 is higher than the bottom surface of the film 106, the top surface of the spacer layer 102, and the top surface of the film 104. Other configurations are also possible.

Figure 17:
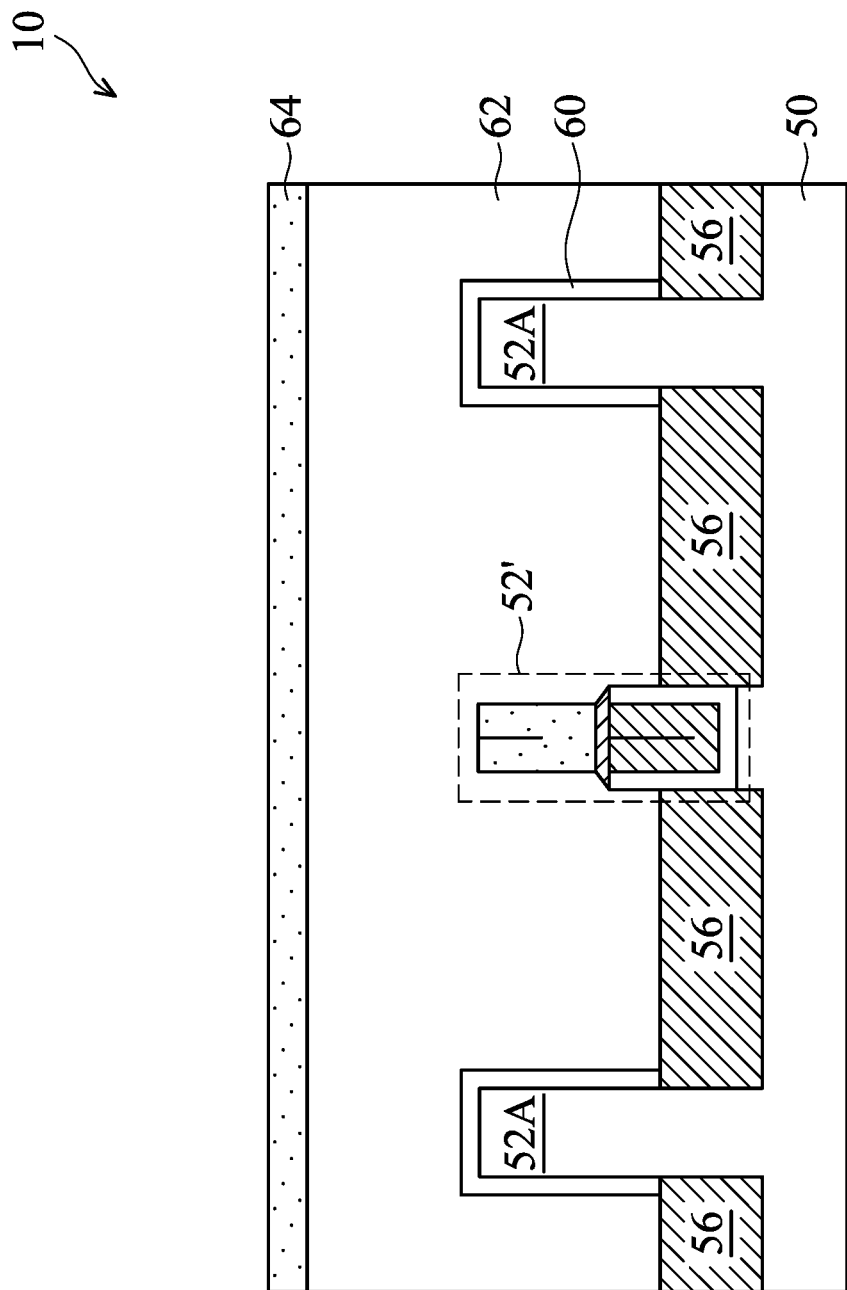

In FIG. 17, a dummy dielectric layer 60 is formed on the fins 52A and the dummy fin 52'. The dummy dielectric layer 60 may be, for example, silicon oxide, silicon nitride, a combination thereof, or the like, and may be deposited or thermally grown according to acceptable techniques.

A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions.

By removing portions of the film 106 from sidewalls of the dummy fin 52', a space between the fins 52 and the dummy fin 52' can be increased. As a result, the dummy gate layer 62 can be deposited in the space around and between the fins 52/dummy fin 52' with fewer defects (e.g., fewer voids).

The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52A for illustrative purposes only. In some embodiments, the dummy dielectric layer 60 may be deposited such that the dummy dielectric layer 60 covers the STI regions 56, extending between the dummy gate layer 62 and the STI regions 56.

Figure 18A:
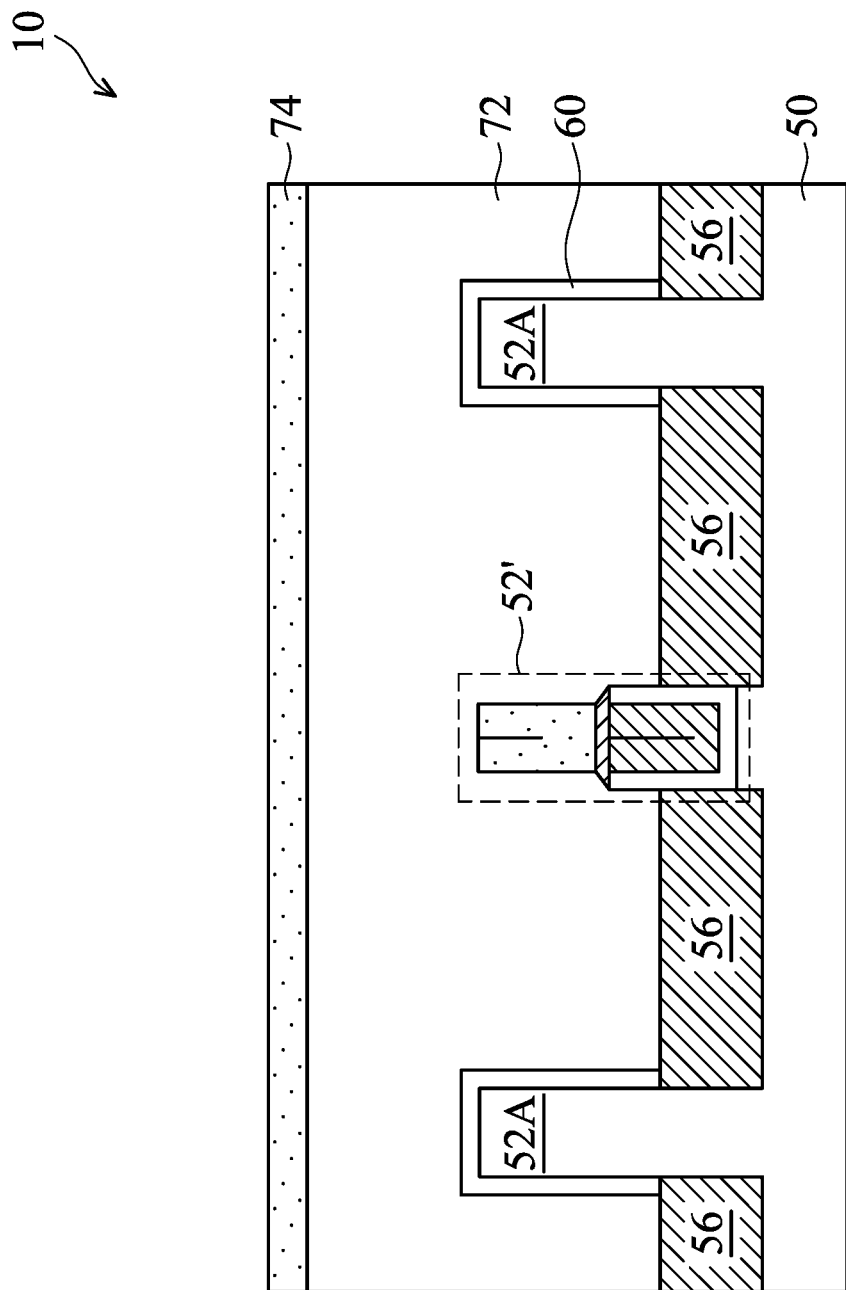
Figure 18B:
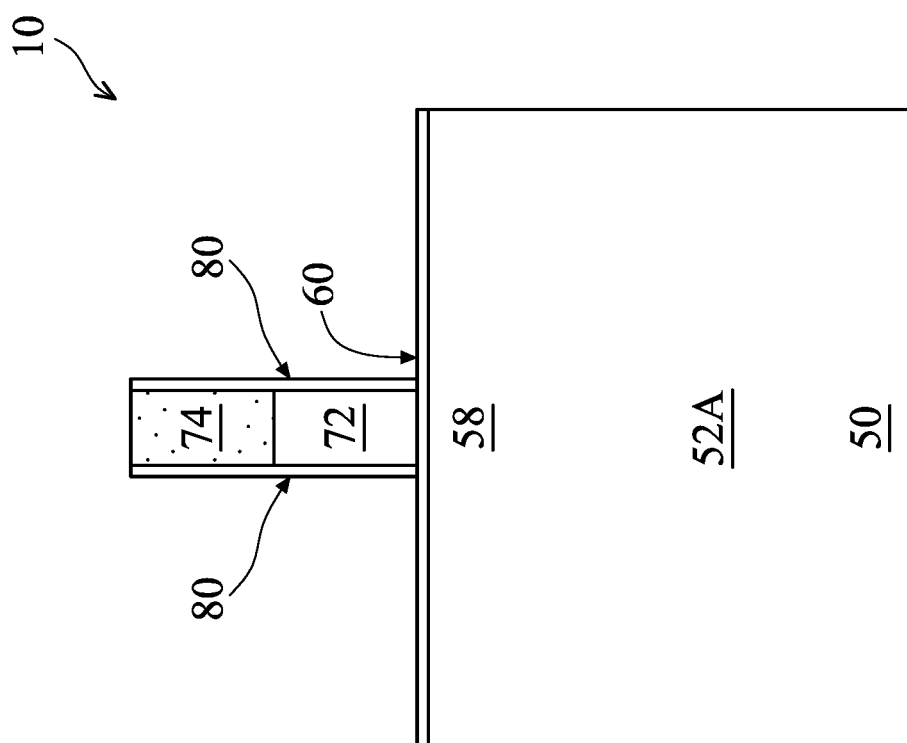

In FIGS. 18A and 18B, the mask layer 64 (see FIG. 17) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52A. The dummy gates 72 also cover top surfaces and sidewalls of the dummy fin 52'. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52A.

Further in FIGS. 18A and 18B, gate seal spacers 80 can be formed on exposed surfaces of the dummy gates 72, the masks 74, and/or the fins 52A/dummy fin 52'. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52A in the region 50P. The mask may then be removed. Subsequently, a mask, such as a photoresist, may be formed over the region 50P while exposing the region 50N, and appropriate type impurities (e.g., n-type) may be implanted into the exposed fins 52A in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 19A:
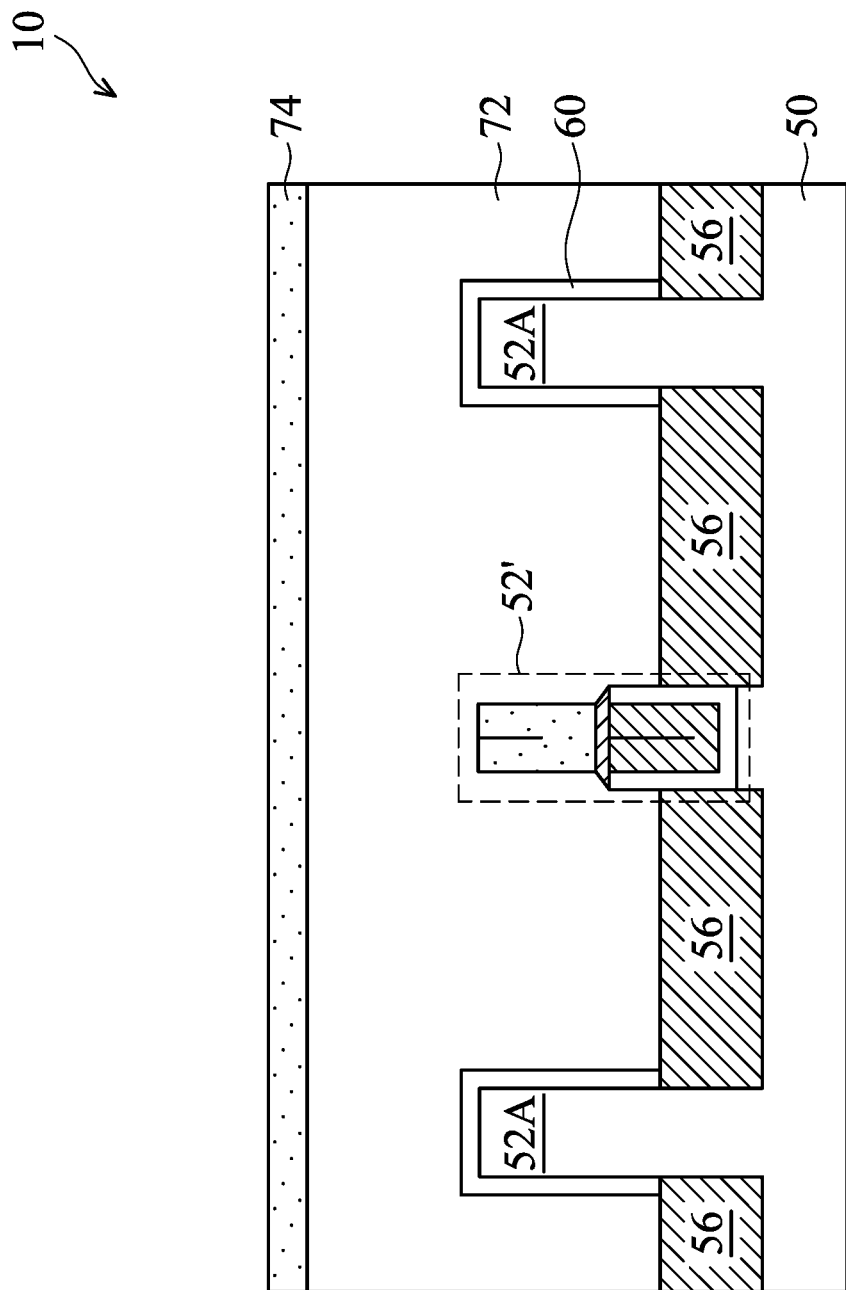
Figure 19B:
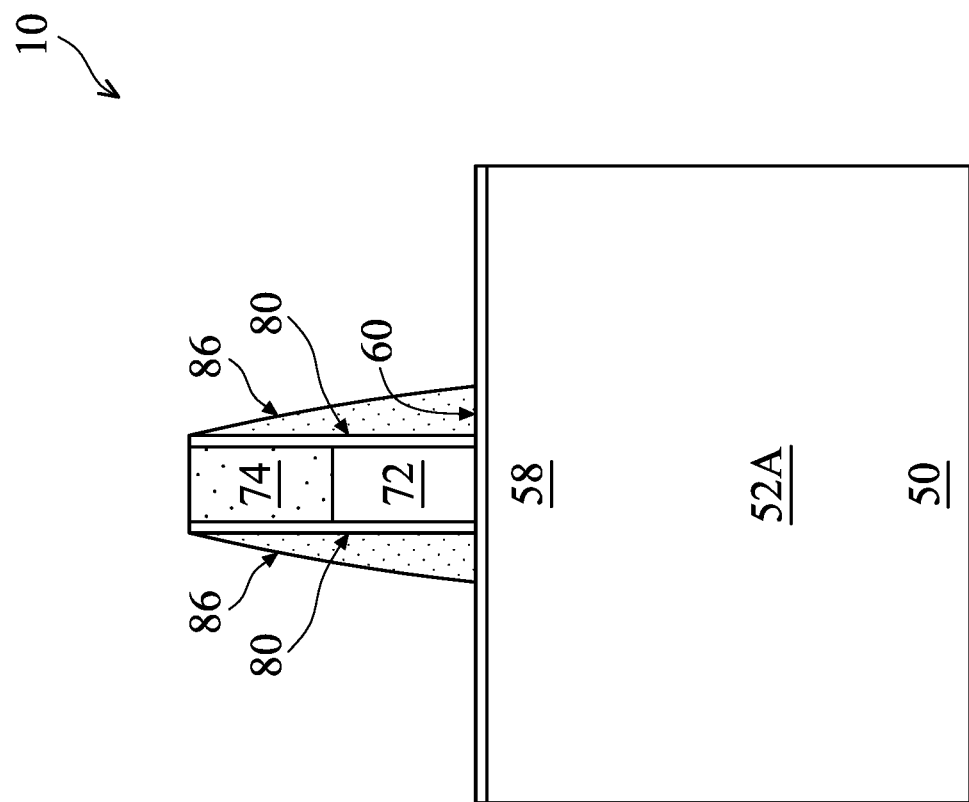

In FIGS. 19A and 19B, gate spacers 86 are formed on the gate seal spacers 80 along sidewalls of the dummy gates 72 and the masks 74. The gate spacers 86 may be formed by conformally depositing an insulation material and subsequently anisotropically etching the insulation material. The insulation material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 20A:
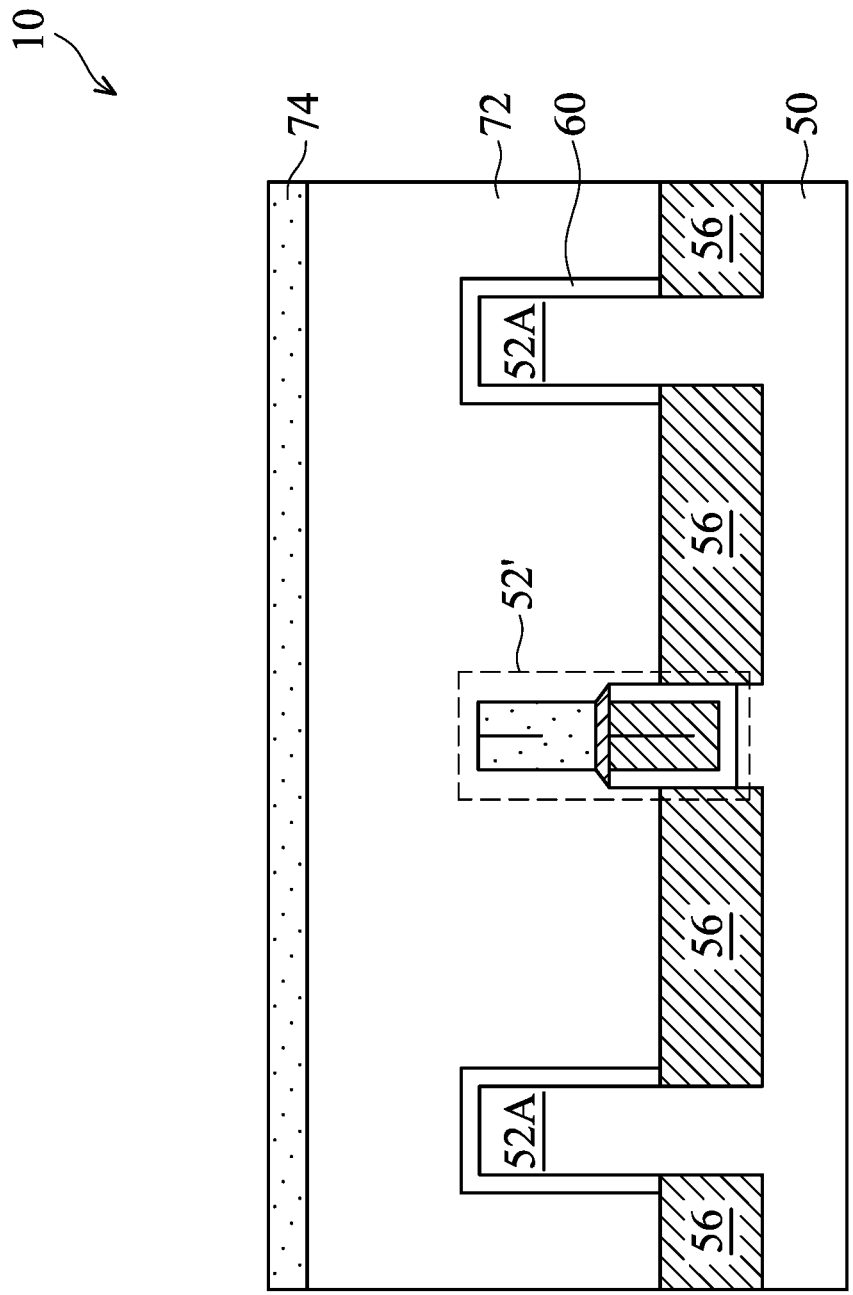
Figure 20B:
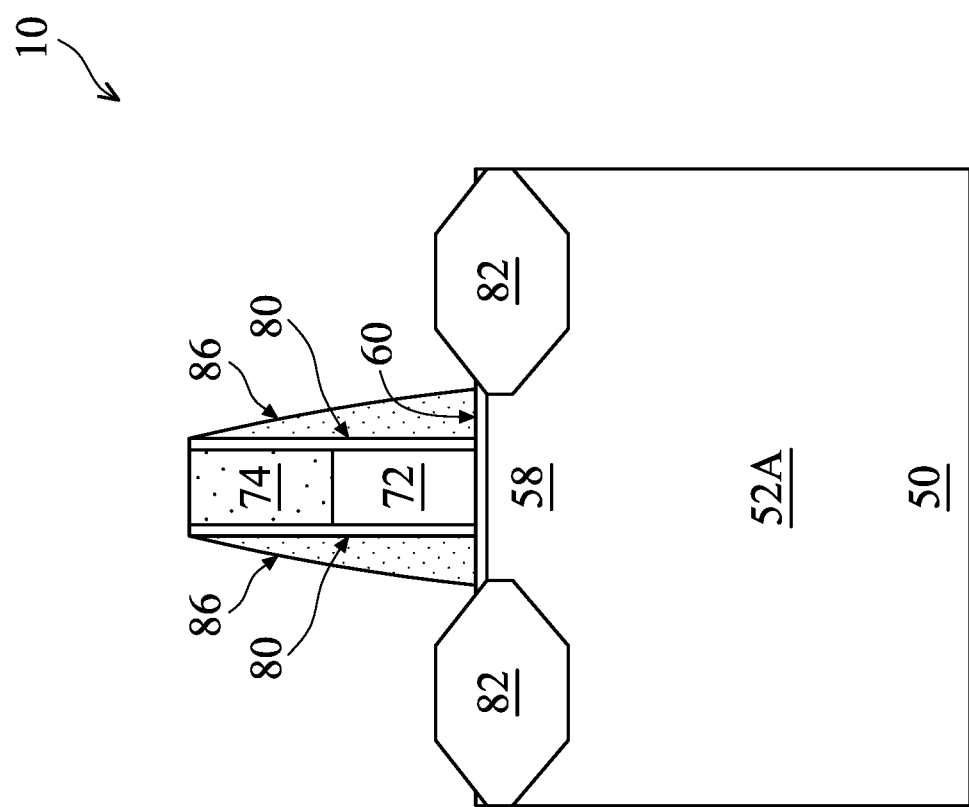
Figure 20C:
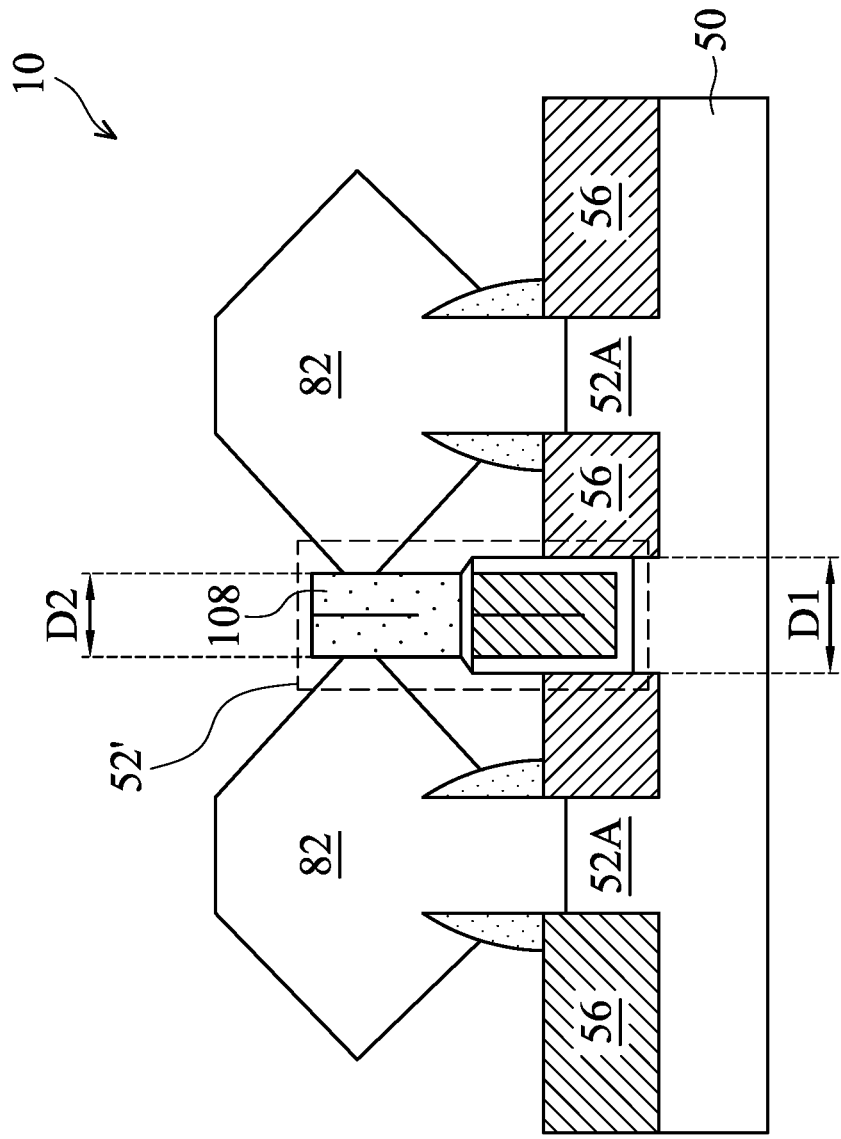

In FIGS. 20A and 20B epitaxial source/drain regions 82 are formed in the fins 52A. The source/drain regions 82 may exert stress in the respective channel regions 58, thereby improving performance. The epitaxial source/drain regions 82 are formed in the fins 52A such that each dummy gate 72 is disposed between respective neighboring pairs of the epitaxial source/drain regions 82. In some embodiments the epitaxial source/drain regions 82 may extend into, and may also penetrate through, the fins 52A. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52A in the region 50N to form recesses in the fins 52A. Then, the epitaxial source/drain regions 82 in the region 50N are epitaxially grown in the recesses. The epitaxial source/drain regions 82 may include any acceptable material, such as appropriate for n-type FinFETs. For example, if the fin 52A is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52A and may have facets.

The epitaxial source/drain regions 82 in the region 50P, e.g., the PMOS region, may be formed by masking the region 50N, e.g., the NMOS region, and etching source/drain regions of the fins 52A in the region 50P are etched to form recesses in the fins 52A. Then, the epitaxial source/drain regions 82 in the region 50P are epitaxially grown in the recesses. The epitaxial source/drain regions 82 may include any acceptable material, such as appropriate for p-type FinFETs. For example, if the fin 52A is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52A and may have facets.

The epitaxial source/drain regions 82 and/or the fins 52A may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52A. Gate spacers 86 are formed covering a portion of the sidewalls of the fins 52A that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

In various embodiments, adjacent source/drain regions 82 remain separated after the epitaxy process is completed as illustrated by FIG. 20C. For example, the source/drain regions 82 may grow to physically contact the dummy fin 52', which physically separates adjacent source/drain regions 82 from each other. Thus, adjacent epitaxial source/drain regions 82 may be prevented from merging and inadvertently shorted out. As discussed above, a material of the film 108 may be selected so it is not significantly etched during source/drain region formation.

The source/drain regions 82 may contact the film 108 of the dummy fin 52', for example. In some embodiments, the middle portion of the dummy fin 52' having the width D2 is the portion of the dummy fin 52' that the epitaxial source/drain regions 82 contact. The width D2 may be less than a width D1 of a lower portion of the dummy fin 52'. The width D1 may be measured at a level of the film 104, and the width D2 may be measured at a level of the film 108.

Figure 21A:
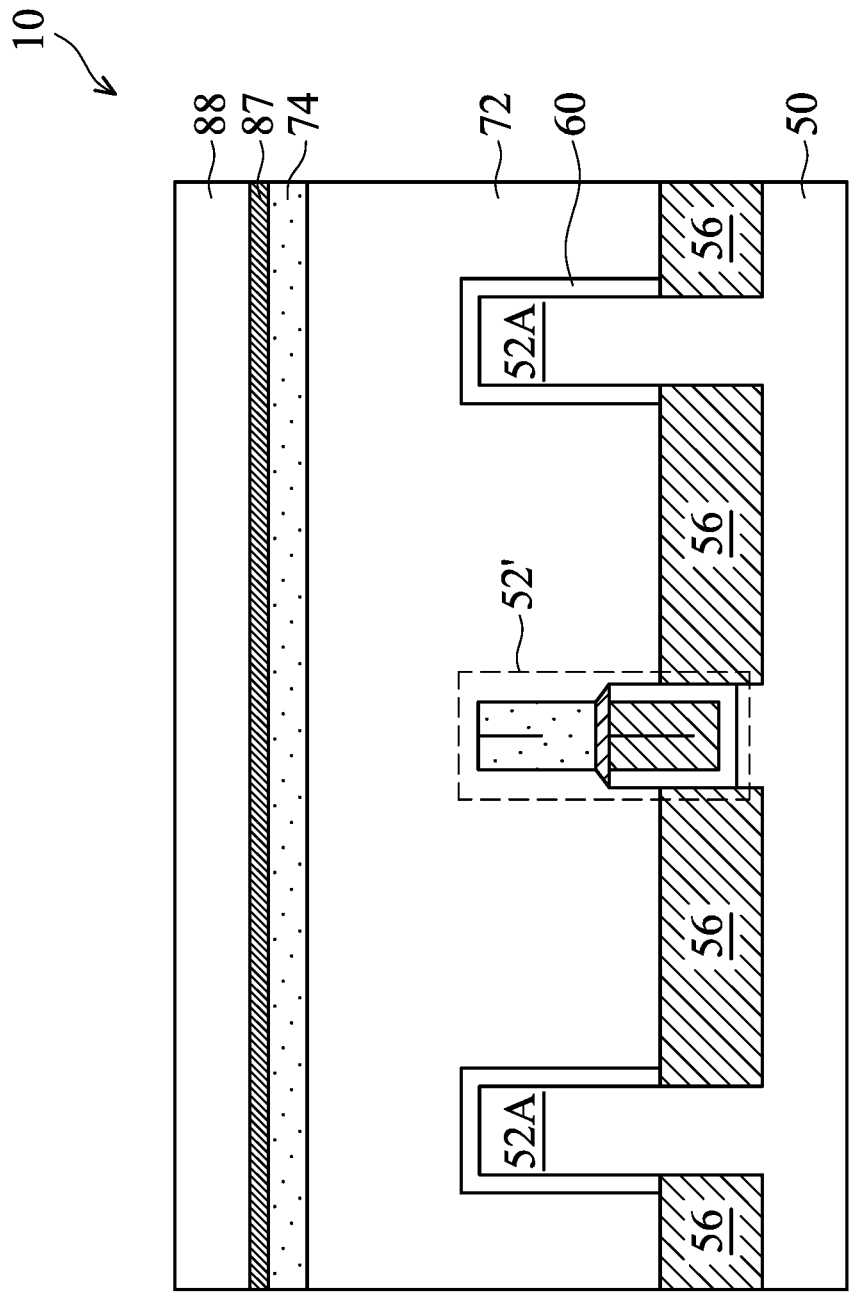
Figure 21B:
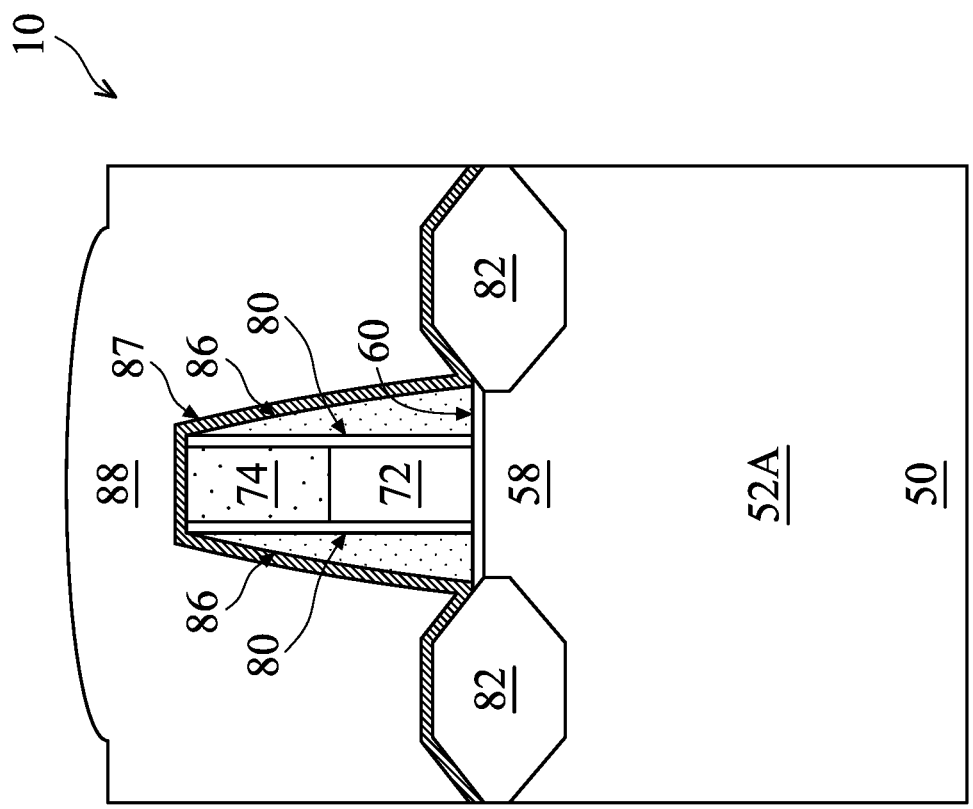

In FIGS. 21A and 21B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 22A:
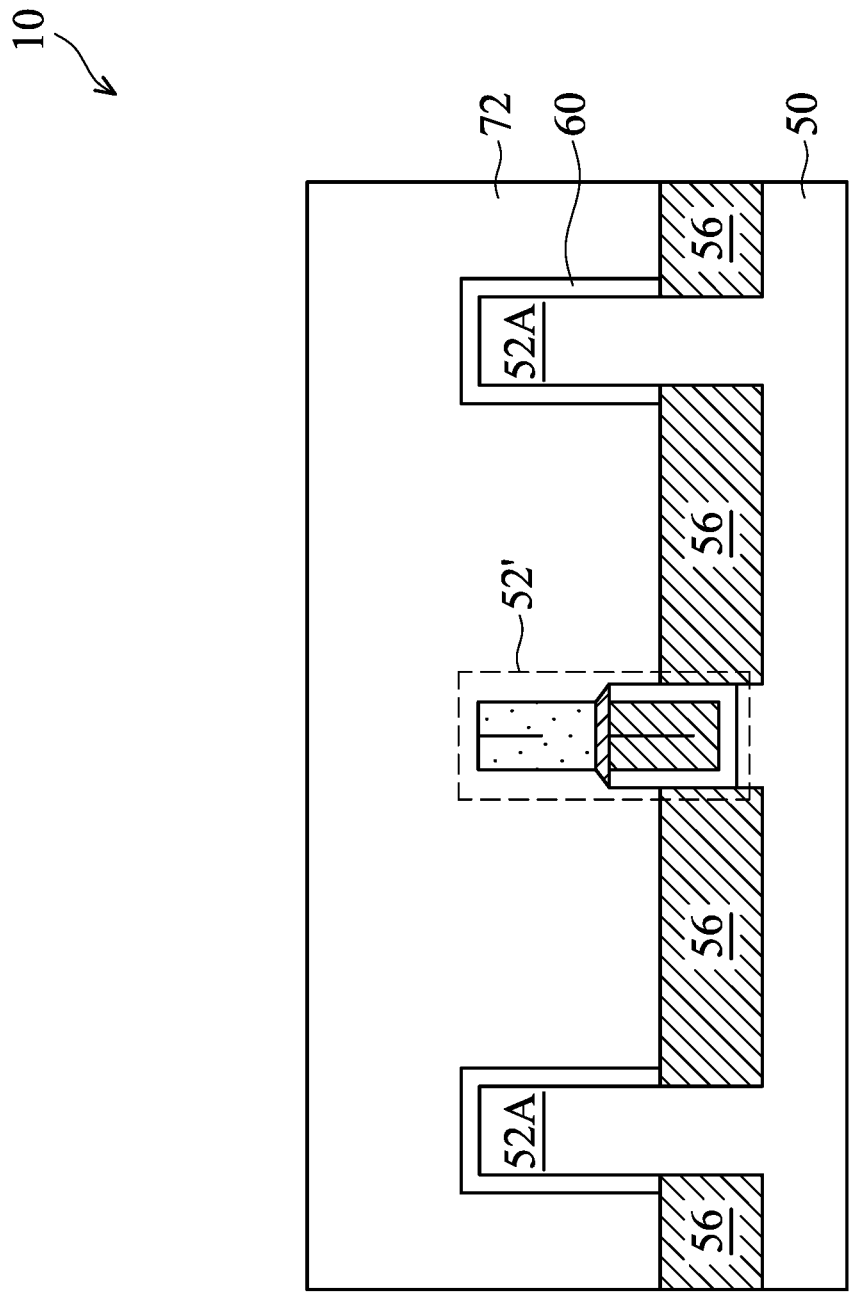
Figure 22B:
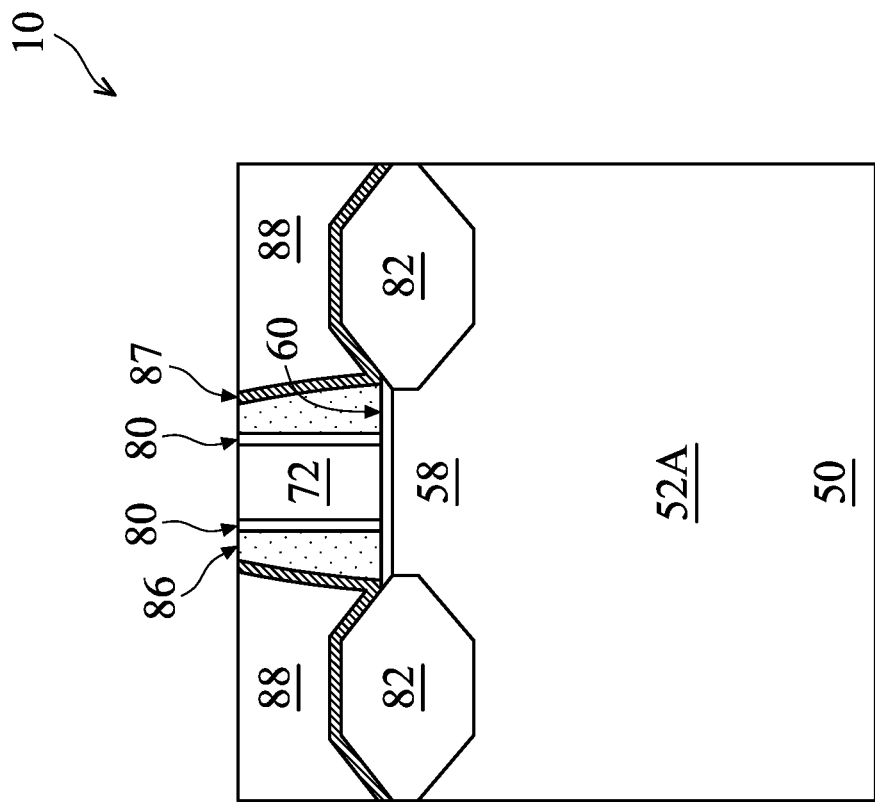

In FIGS. 22A and 22B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 23A:
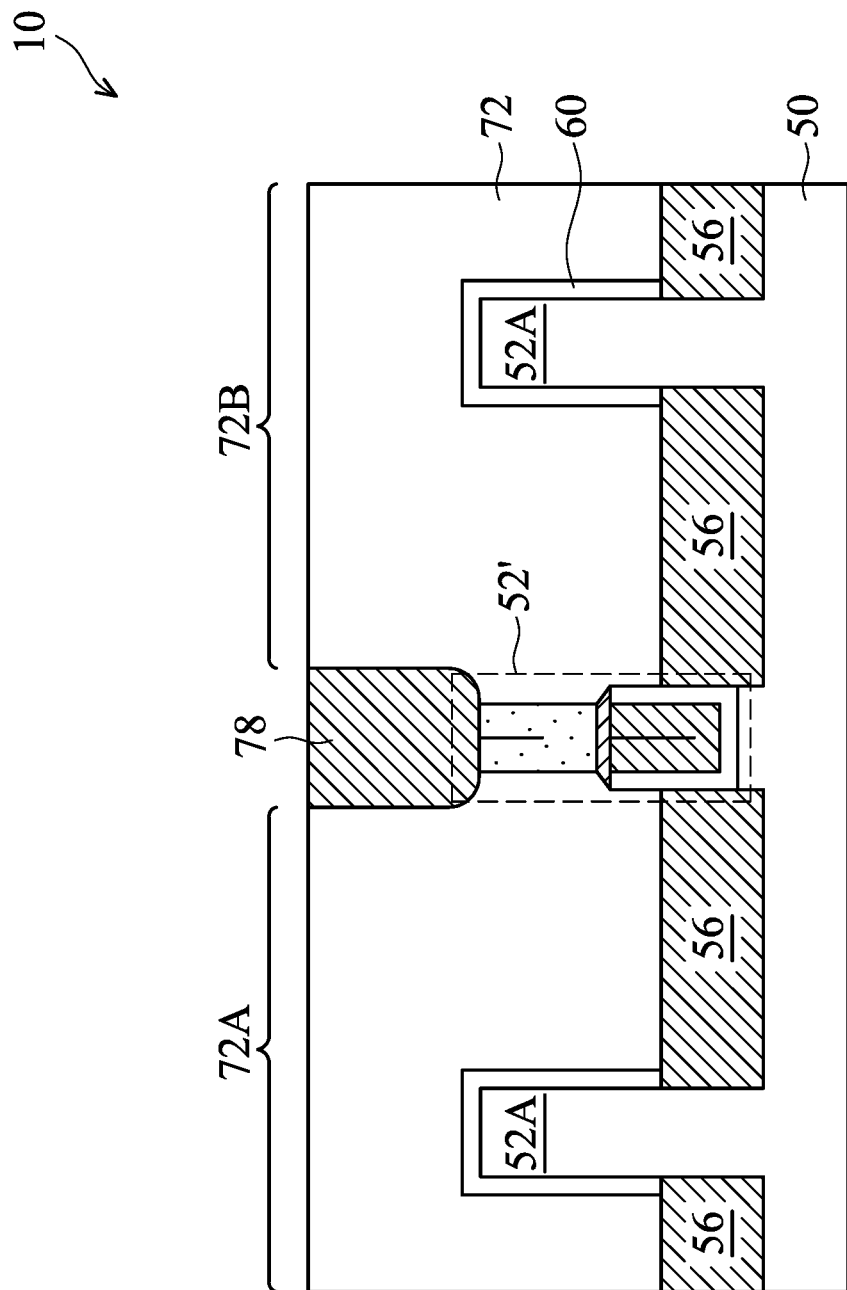
Figure 23B:
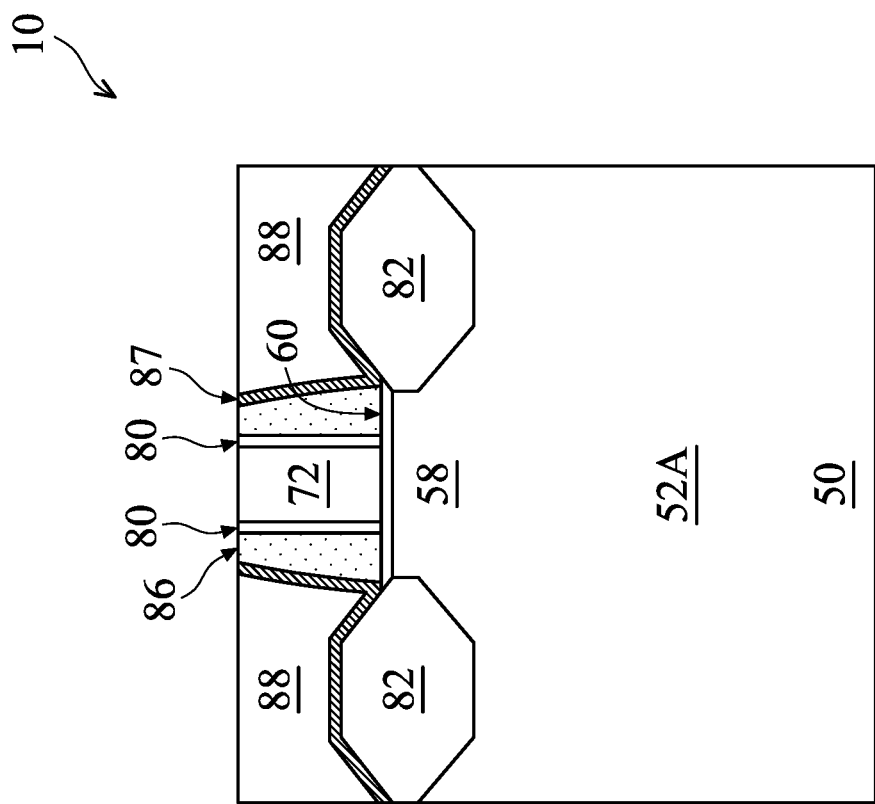

In FIGS. 23A and 23B, a dielectric region 78 is formed to extend through the dummy gate 72 to the dummy fin 52'. The dielectric region 78 may be formed, for example by etching the dummy gate 72 using a wet and/or dry etching process(es). The etching process may expose the dummy fin 52'. Subsequently, a dielectric material such as silicon oxide, silicon nitride, silicon oxynitride, or the like may be deposited in the recess. A planarization process may be performed to remove excess dielectric material from above the dummy gate 72. The dielectric region 78 in combination of with the dummy fin 52' separates the dummy gate 72 into different regions (e.g., regions 72A and 72B). The different regions may correspond to locations of different transistor devices, for example. Thus, the dielectric region 78 and the dummy fin 52' may provide isolation between adjacent FinFETs.

Figure 24A:
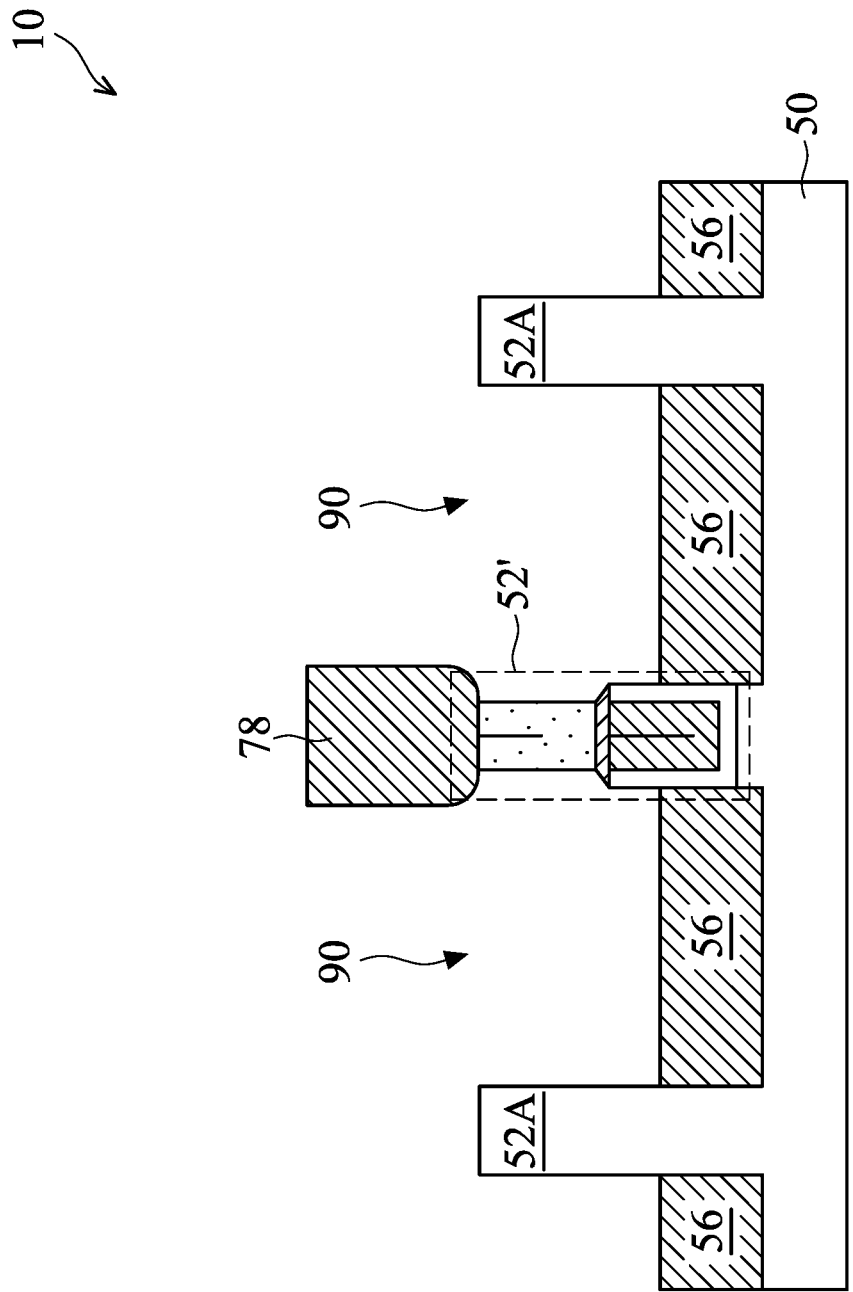
Figure 24B:
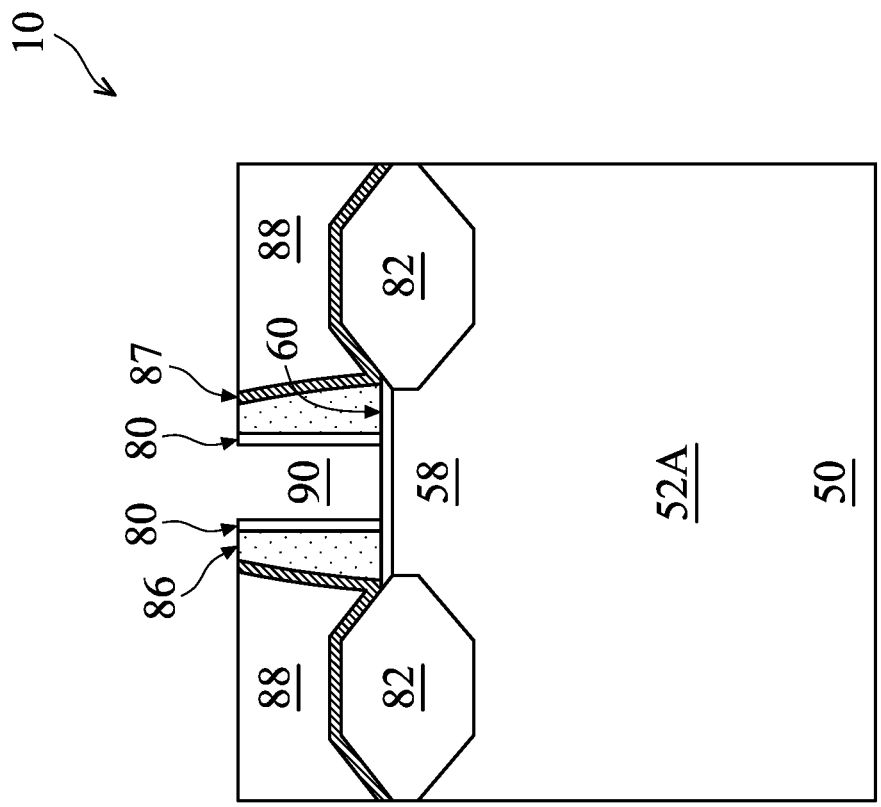

In FIGS. 24A and 24B, the remaining dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52A. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 25A:
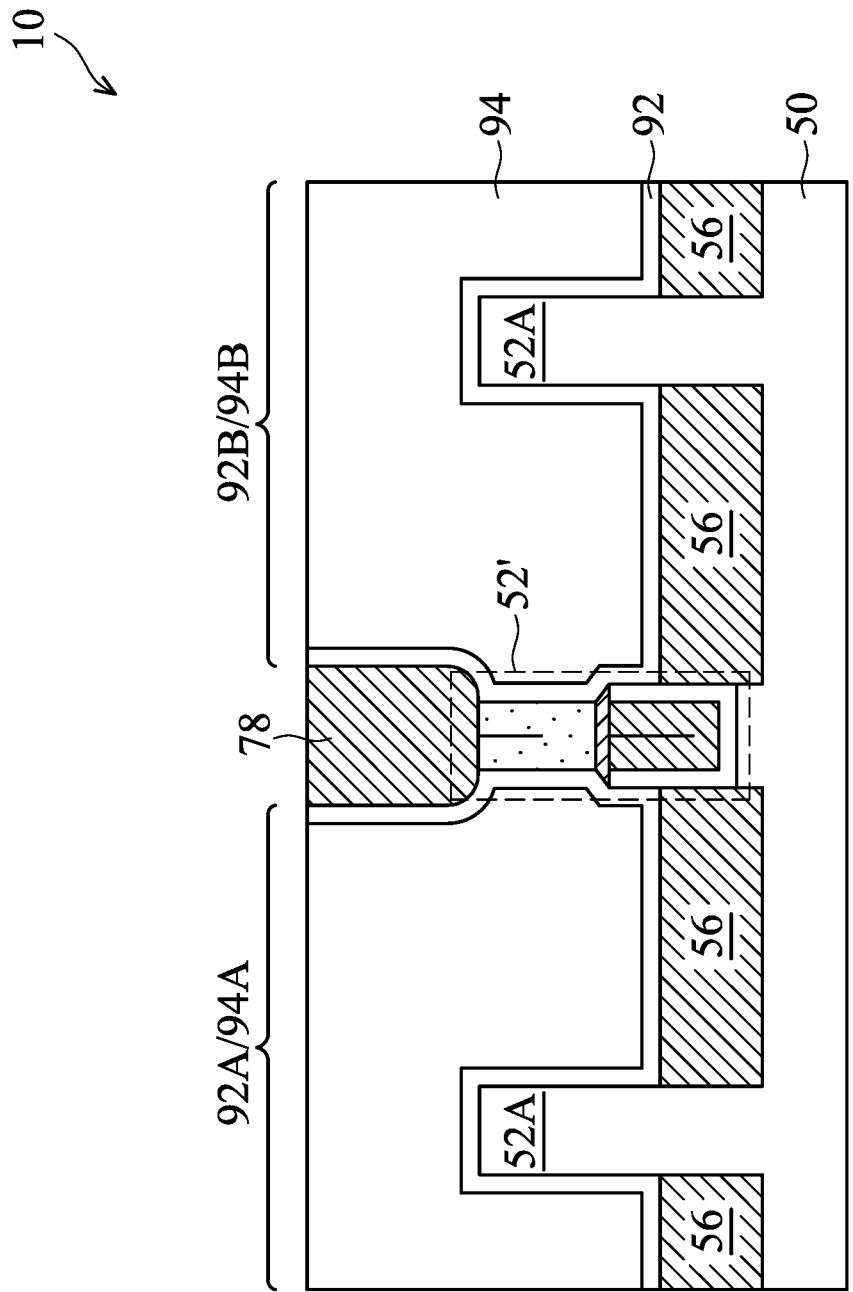
Figure 25B:
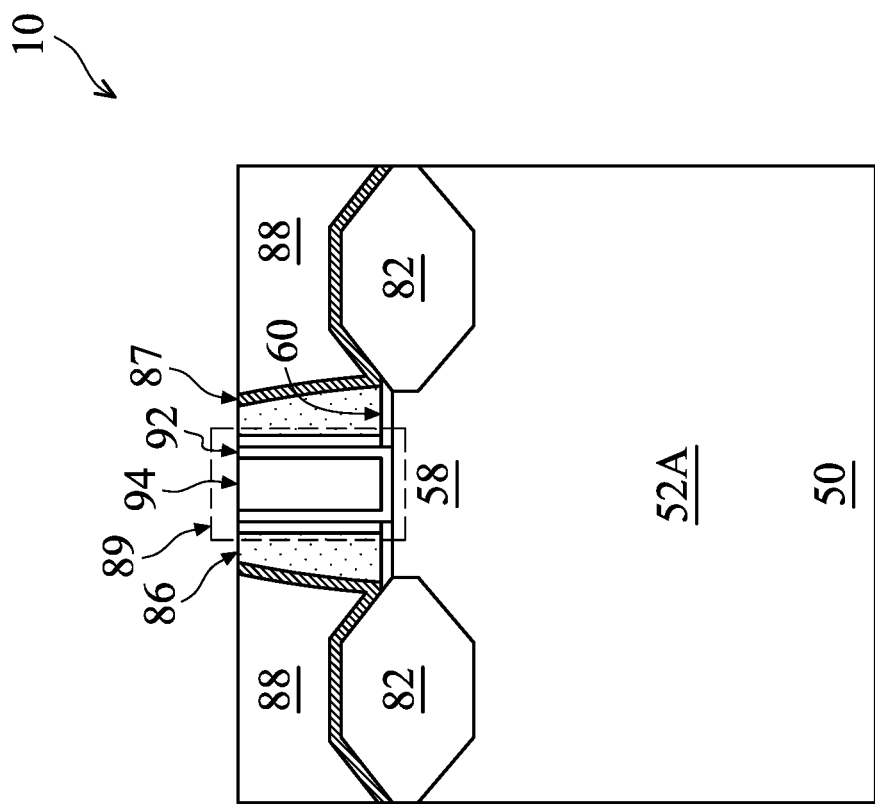
Figure 25C:
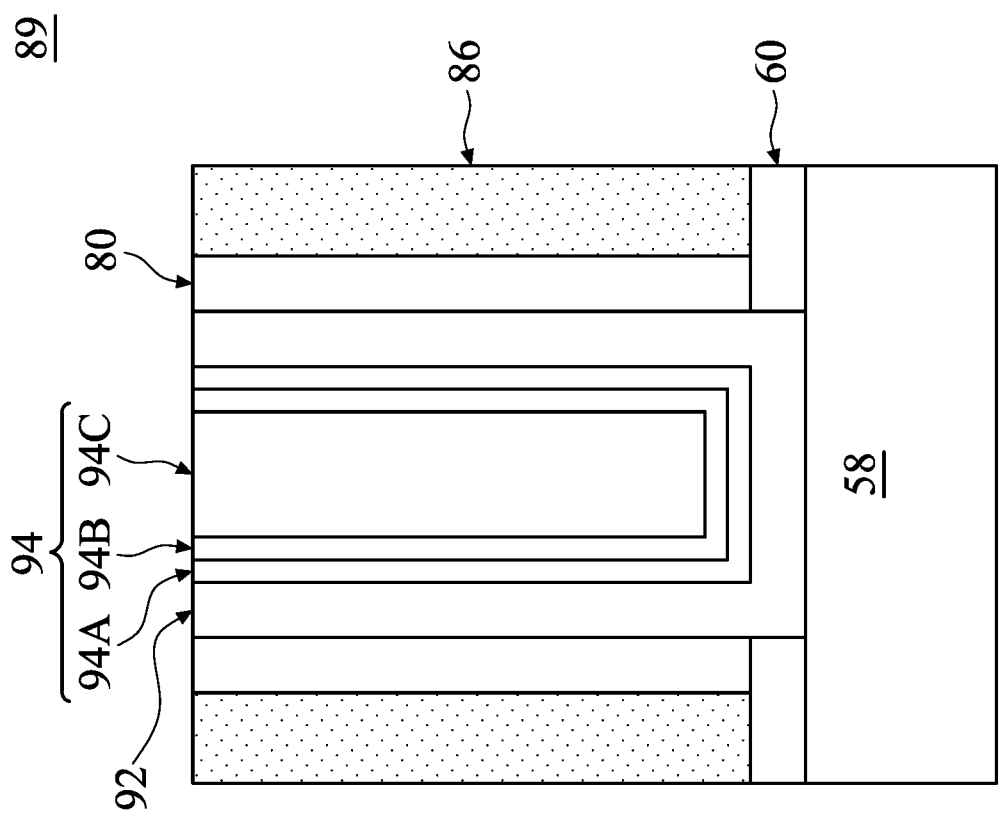

In FIGS. 25A and 25B, gate dielectric layers 92 and gate electrodes 94 are formed for replacement gates. FIG. 25C illustrates a detailed view of region 89 of FIG. 25B. Gate dielectric layers 92 are deposited conformally in the recesses 90, such as on the top surfaces and the sidewalls of the fins 52A, on sidewalls of the dummy fin 52', on sidewalls of the dielectric region 78, and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. By removing portions of the film 106 from sidewalls of the dummy fin 52', a space between the fins 52 and the dummy fin 52' can be increased. As a result, the gate electrodes 94 can be deposited in the space around and between the fins 52/dummy fin 52' with fewer defects (e.g., fewer voids).

The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 25B, the gate electrode 94 may comprise any number of liner layers 94A, any number of work function tuning layers 94B, and a fill material 94C as illustrated by FIG. 25C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52A. The dielectric region 78 and the dummy fin 52' isolates adjacent gate stacks (e.g., gate stack 92A/94A and gate stack 92B/94B) when the adjacent gate stacks correspond to different FinFETs.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 26A:
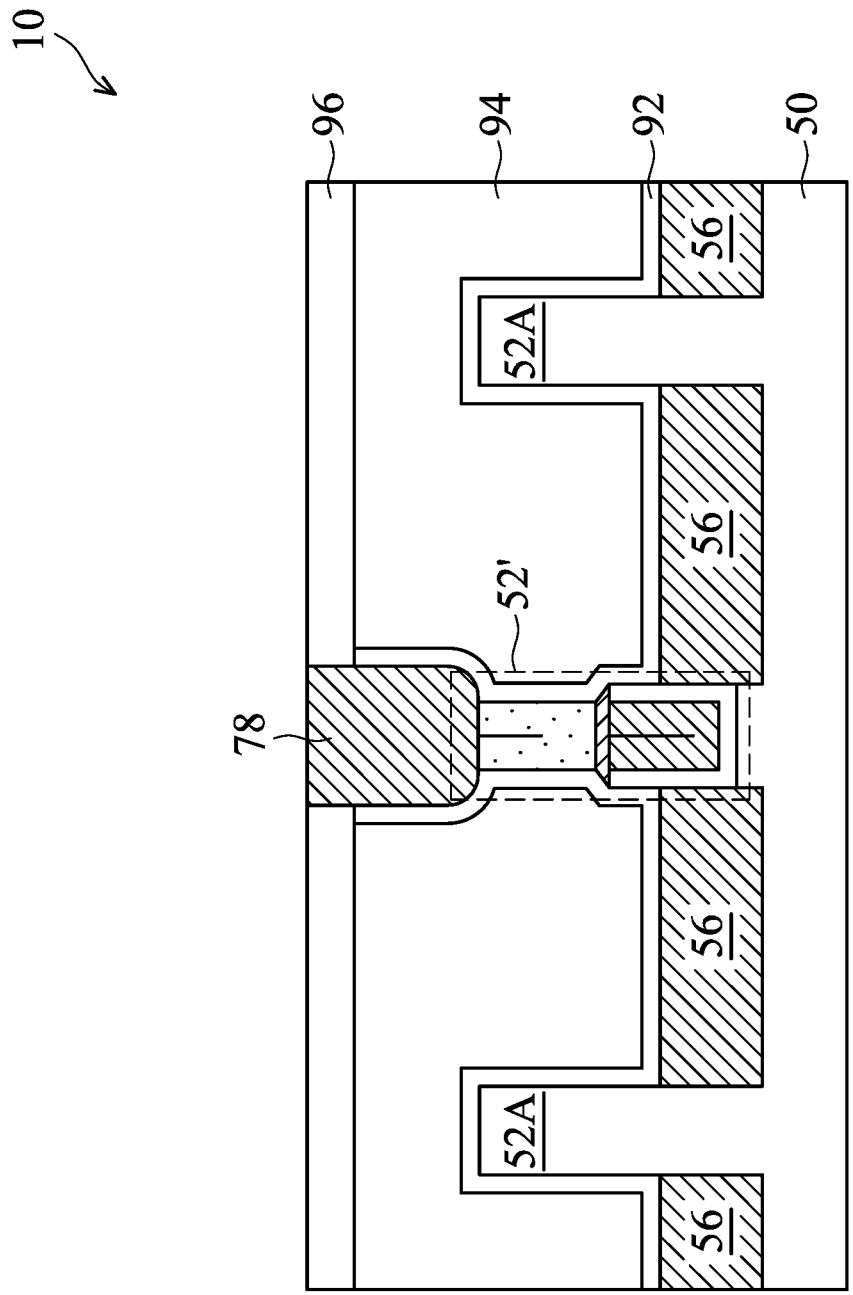
Figure 26B:
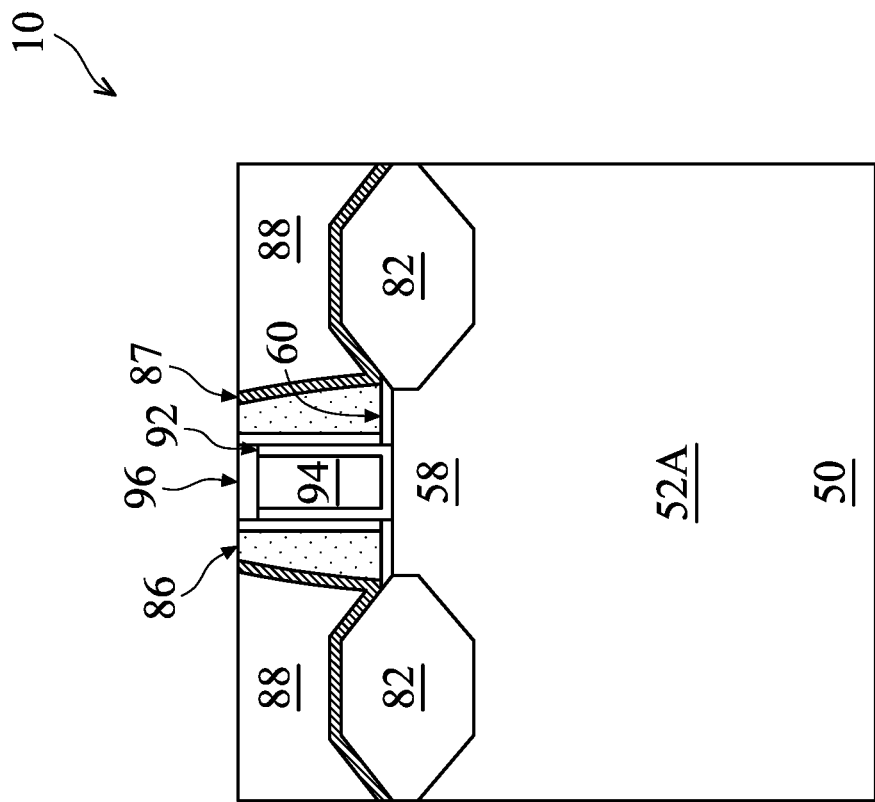

In FIGS. 26A and 26B, the gate stack (including a gate dielectric layer 92 and a corresponding overlying gate electrode 94) is recessed, so that a recess is formed directly over the gate stack and between opposing portions of gate spacers 86. The etching process may be selective such that the dielectric region 78 is not significantly etched. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 27A and 27B) penetrate through the gate mask 96 to contact the top surface of the recessed gate electrode 94. The dielectric region 78 may extend through the gate mask 96.

Figure 27B:
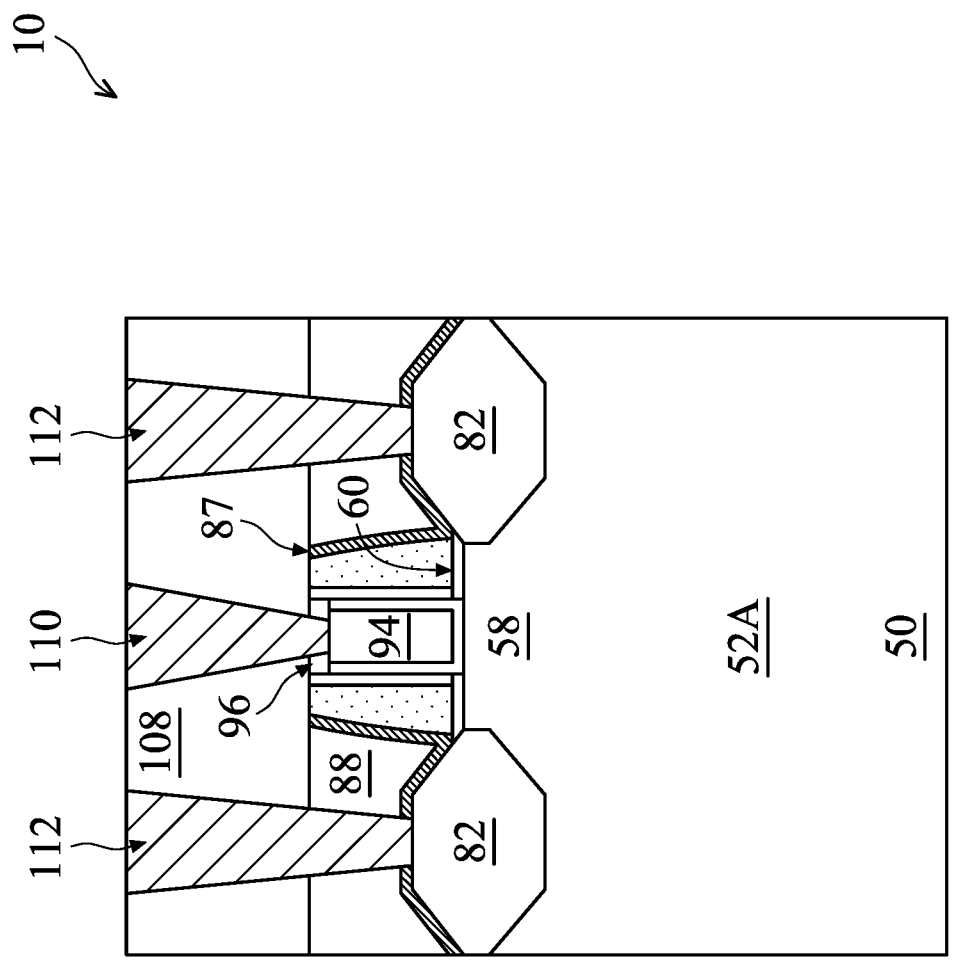

In FIGS. 27A and 27B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD.

Also illustrated in FIGS. 27A and 27B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 28A:
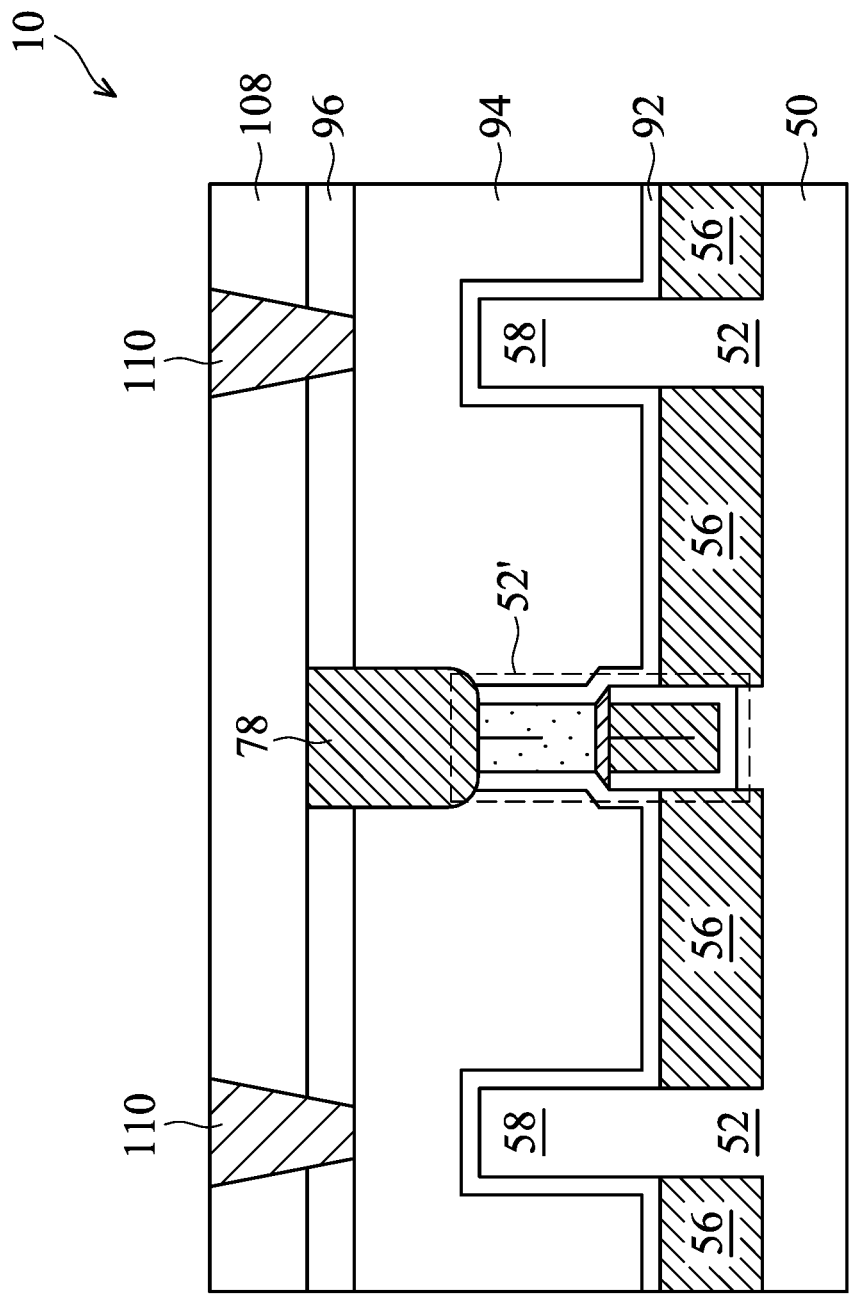
Figure 28B:
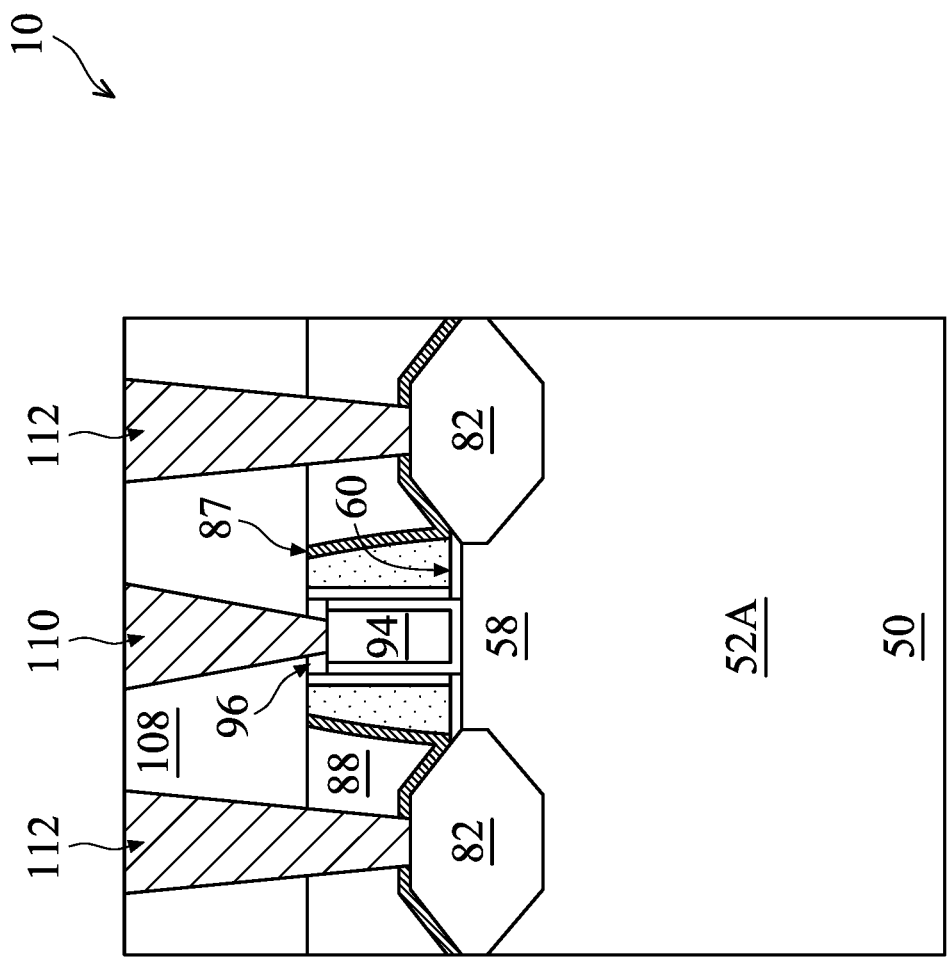

The above embodiments describe the dielectric region 78 being formed prior to the gate stacks 92/94. In other embodiments, the gate stacks (e.g., comprising gate dielectric 92 and gate electrodes 94) may be formed prior to forming the dielectric region 78. Subsequently, the gate stacks 92/94 may be etched to expose the dummy fin 52', and a dielectric material may be deposited to form the dielectric region 78. The resulting structure is illustrated in FIGS. 28A and 28B.

Figure 29:
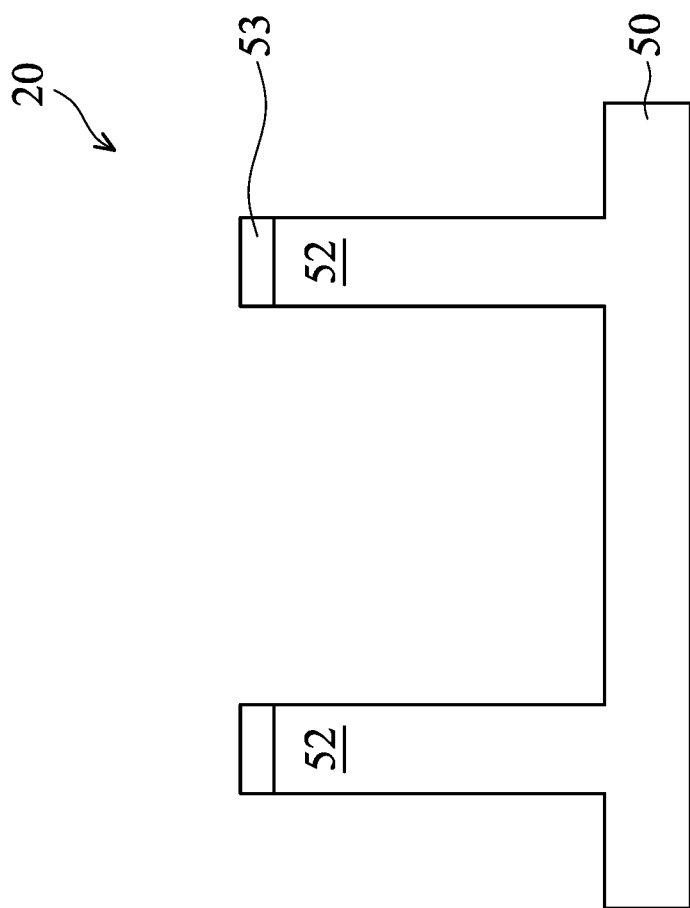
FIGS. 29, 30, 31, 32, 33, 34, 35, 36A, 36B, 36C, 37A, 37B, and 37C are cross-sectional views of intermediate stages in the manufacturing of FinFETs, in accordance with some alternative embodiments.

FIGS. 29 through 37C illustrate cross-sectional view of intermediate steps of manufacturing a device 20 with dummy fins 52' according to an alternative embodiment. In FIGS. 29 through 37C, like reference numbers indicate like elements formed using like processes as the features described above in FIGS. 2 through 28B. In FIGS. 29, fins 52 are formed extending from a substrate 50. A hard mask 53, is used to pattern the fins 52, and may remain on the fins 52.

Figure 30:
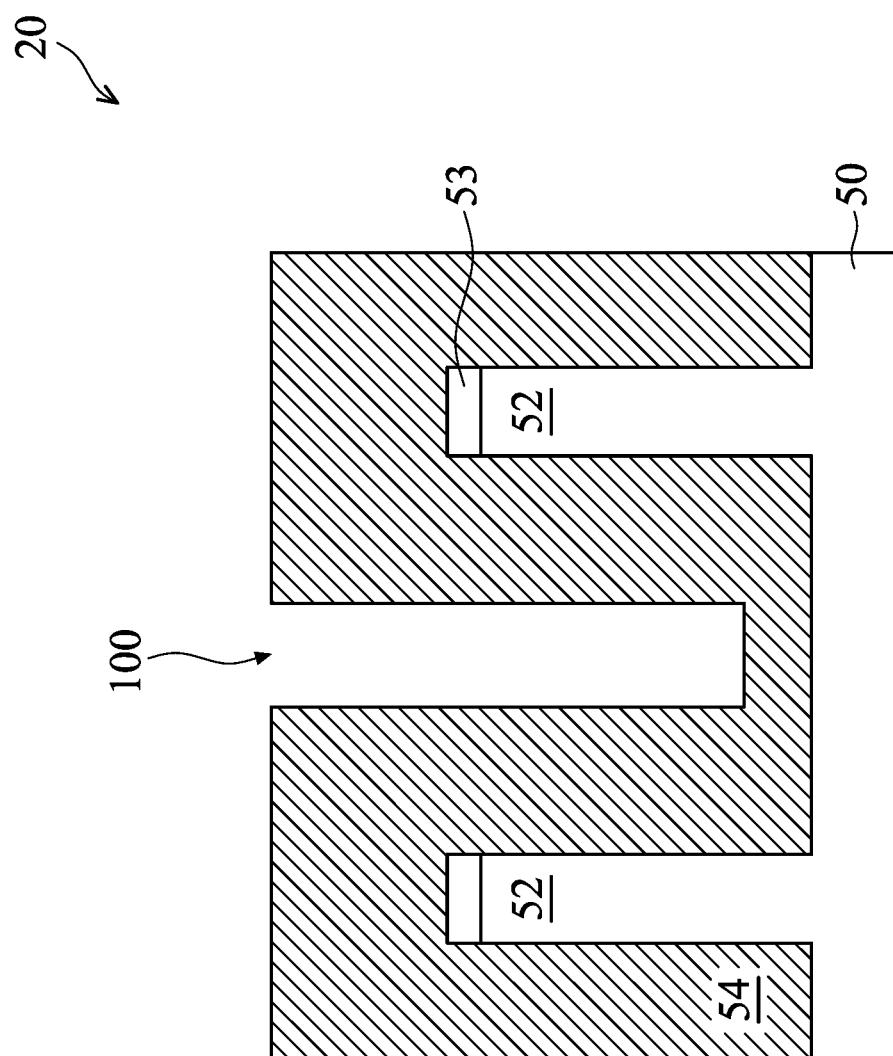

In FIG. 30, an insulation material 54 is deposited over and along sidewalls of the fins 52. The insulation material 54 may be deposited using a conformal process, which only partially fills a space between the fins 52. As a result of the deposition process, the opening 100 is defined between the fins 52 and over the insulation material 54. Materials may be subsequently filled in the opening 100 for forming a dummy fin 52'

Figure 31:
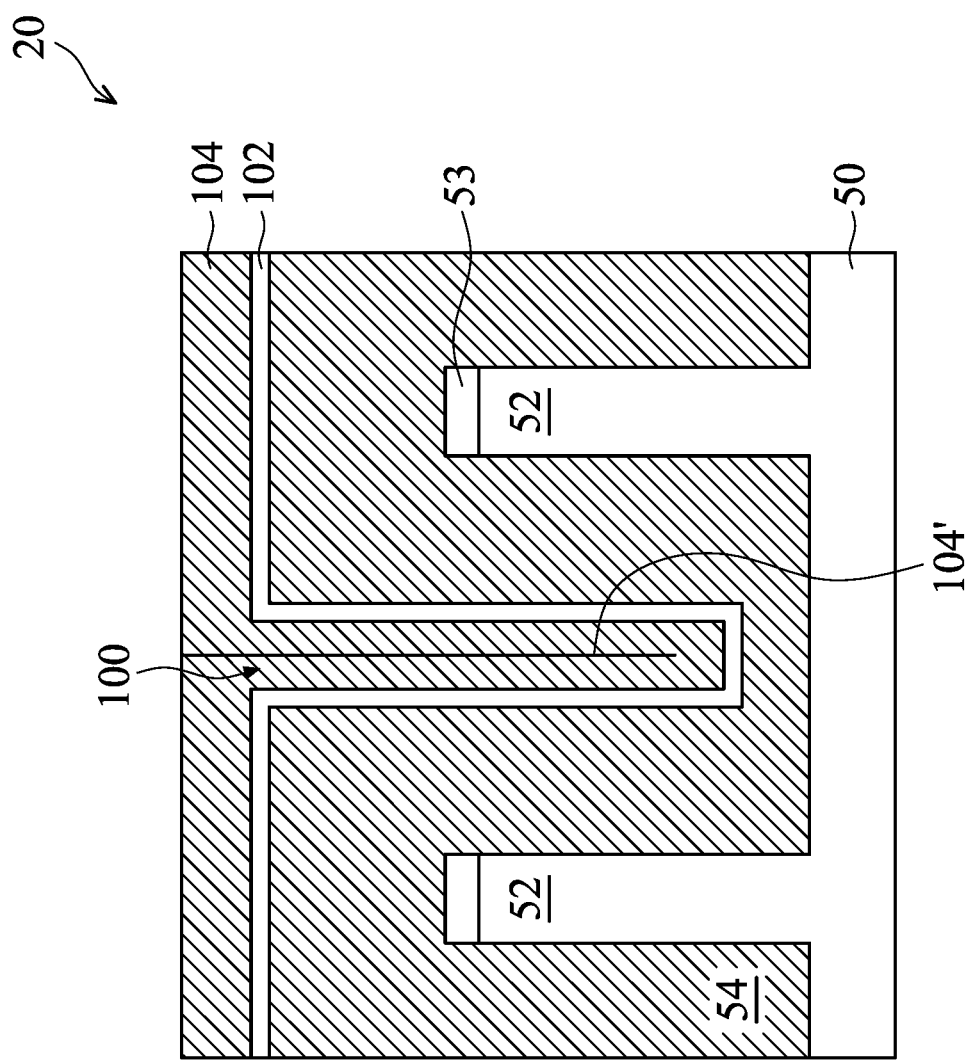

In FIG. 31, an optional spacer layer 102 and a film 104 is deposited in the opening. Depositing the spacer layer 102 and the film 104 may be performed using a similar process as described above with respect to FIGS. 6 and 7.

Figure 32:
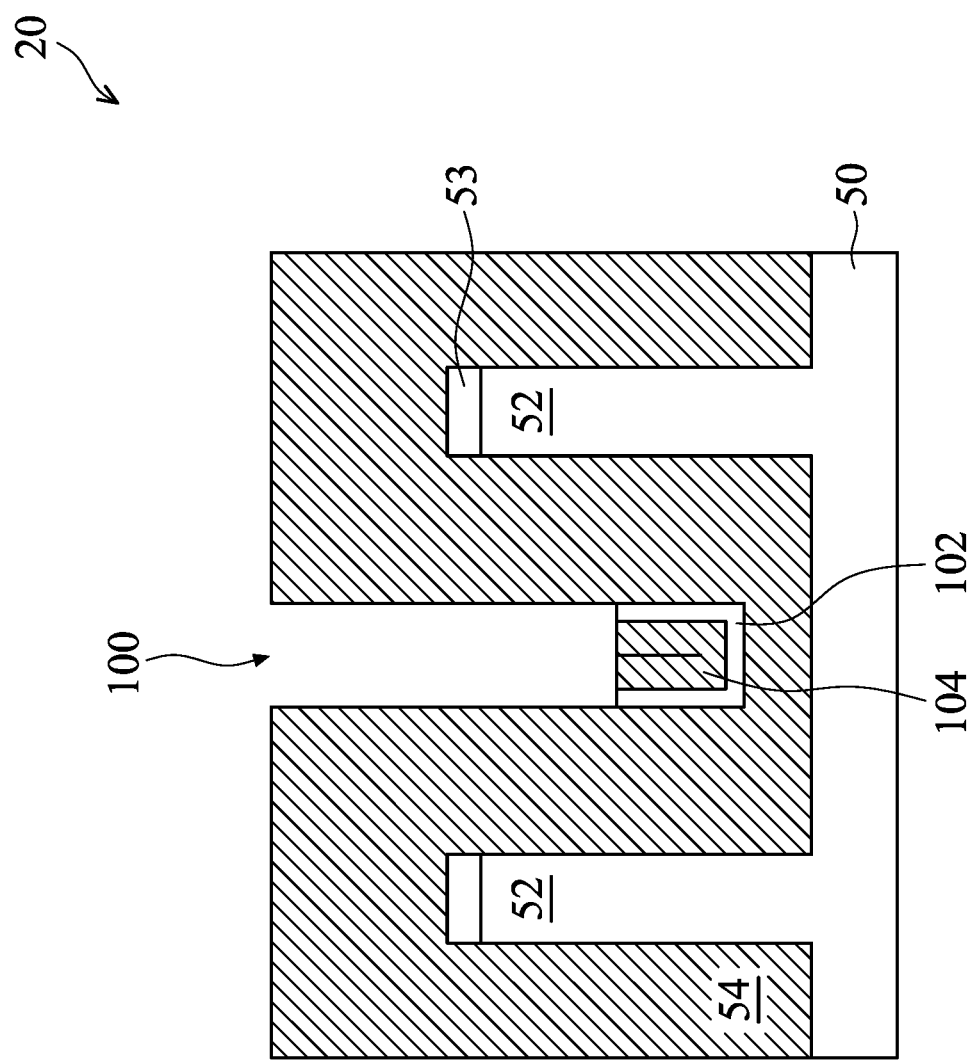

In FIG. 32, the optional spacer layer 102 and the film 104 are sequentially recessed. Recessing the spacer layer 102 and the film 104 may be performed using a similar process as described above with respect to FIGS. 8 and 9.

Figure 33:
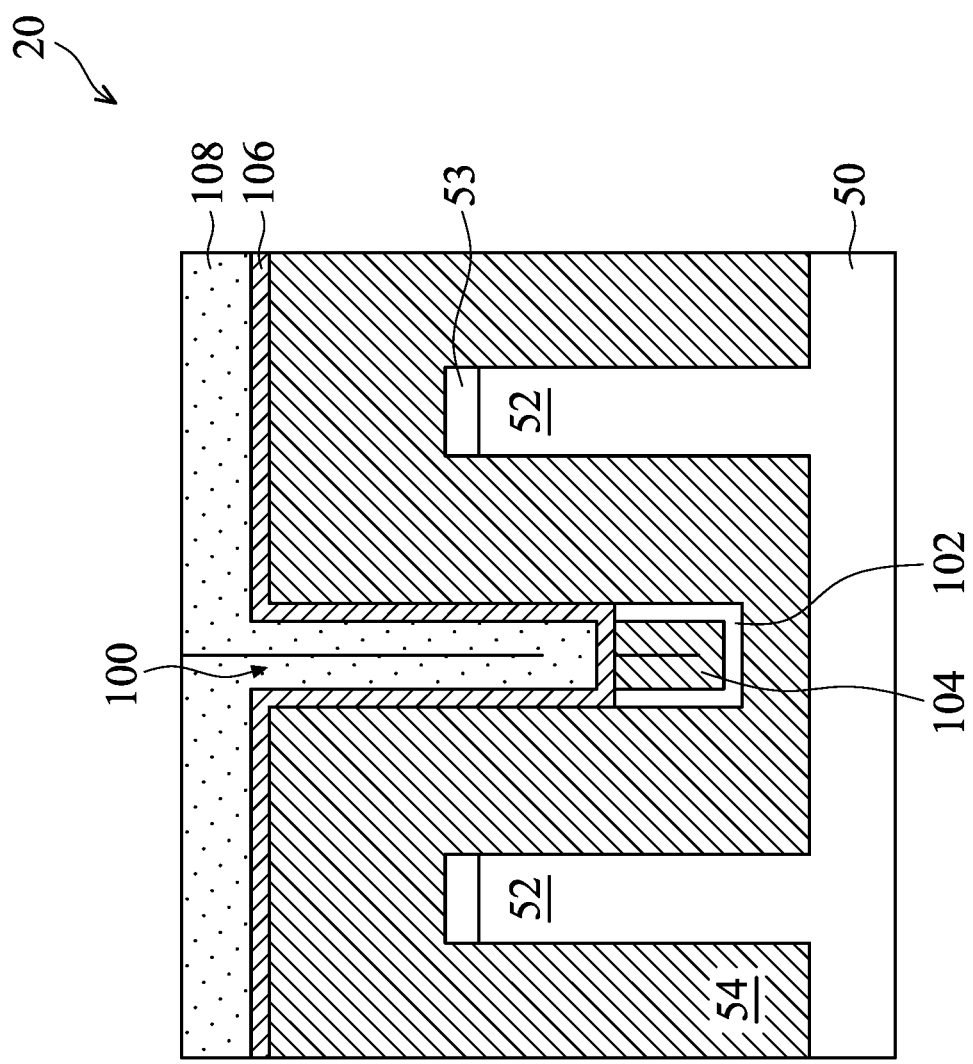

In FIG. 33, films 106 and 108 are deposited in the opening 100. Films 106 and 108 may be deposited over the spacer layer 102 and the film 104. Depositing the films 106 and 108 may be performed using a similar process as described above with respect to FIGS. 10 and 11. Film 108 may be a single layer structure or a multilayer structure.

Figure 34:
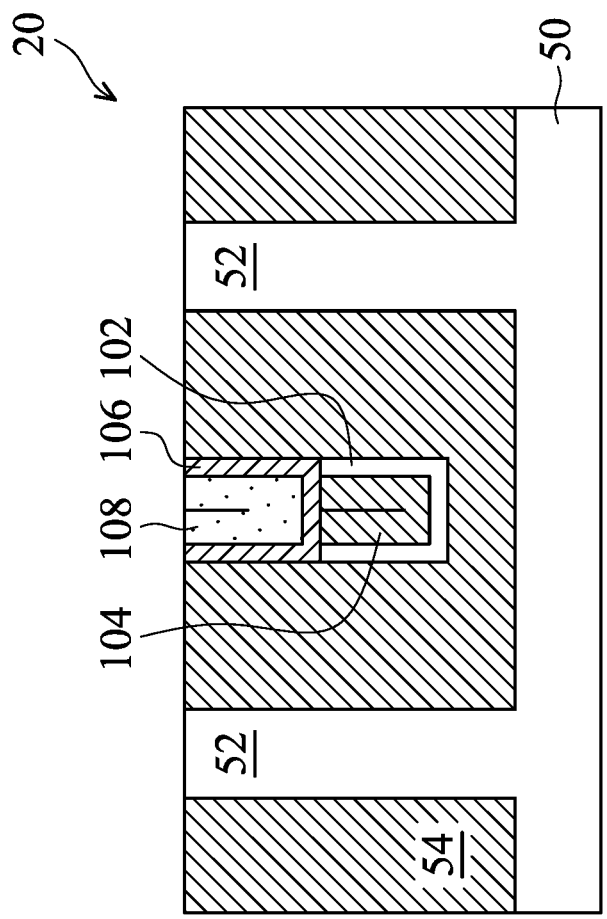

In FIG. 34, a removal process is applied to the film 106, the film 108, the insulation material 54, and the hard mask 53 (if present) to remove excess material over the fins 52. In some embodiments, a planarization process such as a chemical mechanical polish (CMP), an etch-back process, combinations thereof, or the like may be utilized. The planarization process exposes the fins 52 such that top surfaces of the fins 52, the insulation material 54, the film 106, and the film 108 are level after the planarization process is complete.

Figure 35:
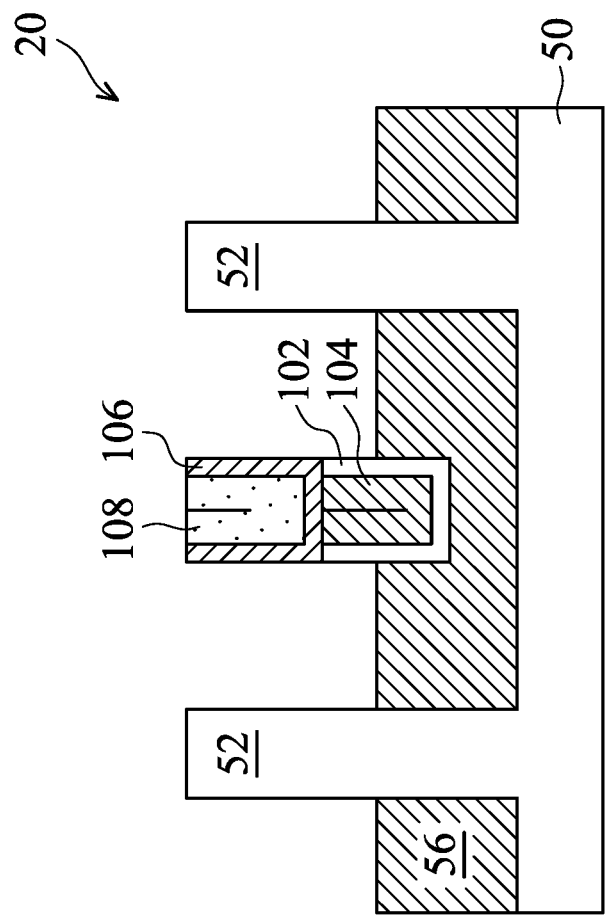

In FIG. 35, the insulation material 54 is etched back to expose sidewalls of the fins 52 and define STI region 56. Etching back the insulation material 54 may be performed using a similar process as described above with respect to FIG. 13. As a result of the etch back, a top surface of the STI region 56 may be below a top surface of the film 104, above a top surface of the film 104 (e.g., see FIG. 36B), or substantially level with the top surface of the film 14 (e.g., see FIG. 36C).

Figure 36A:
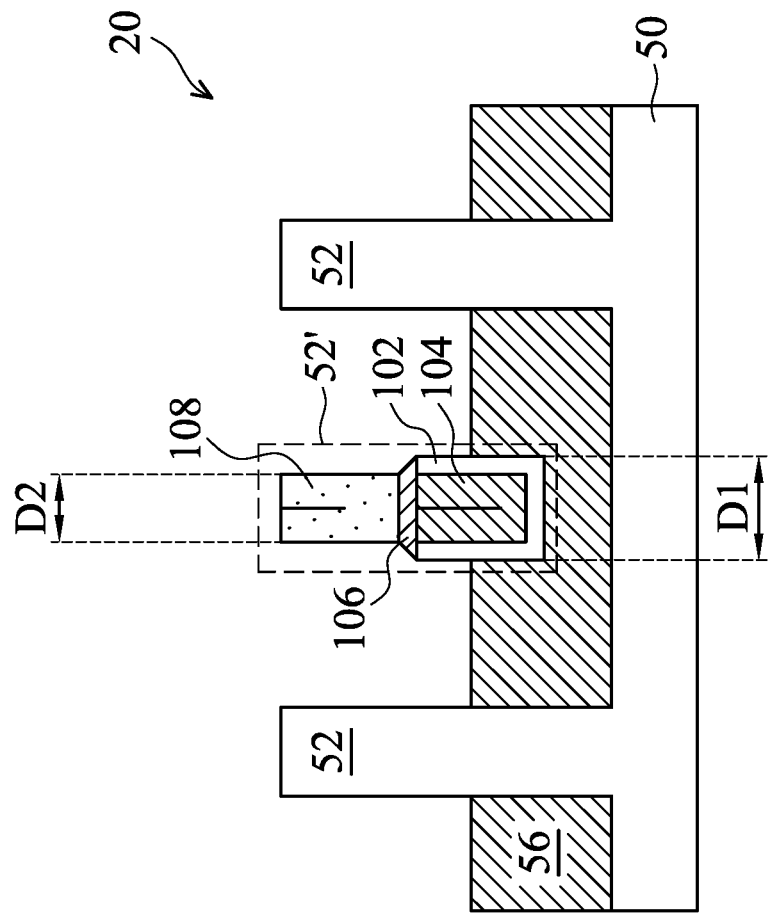
Figure 36B:
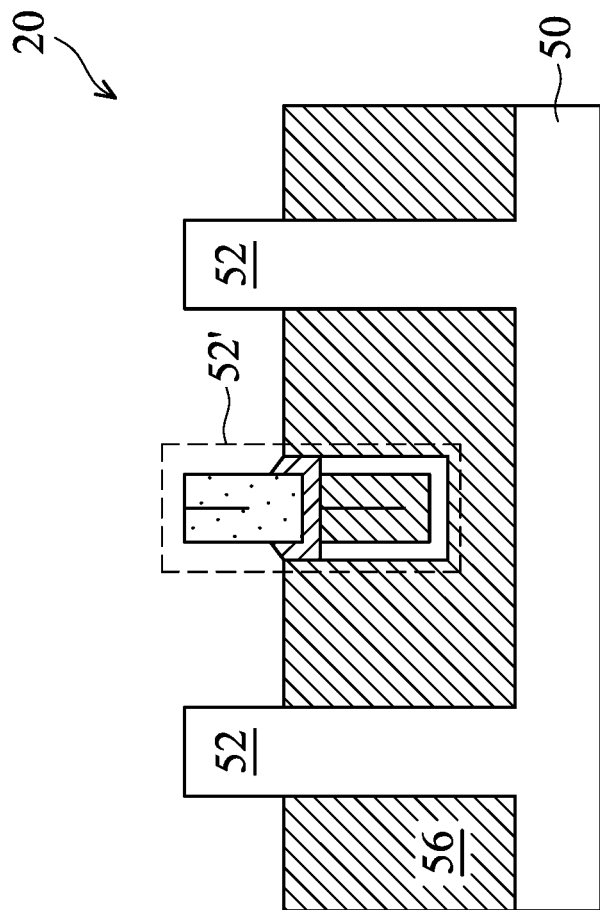
Figure 36C:
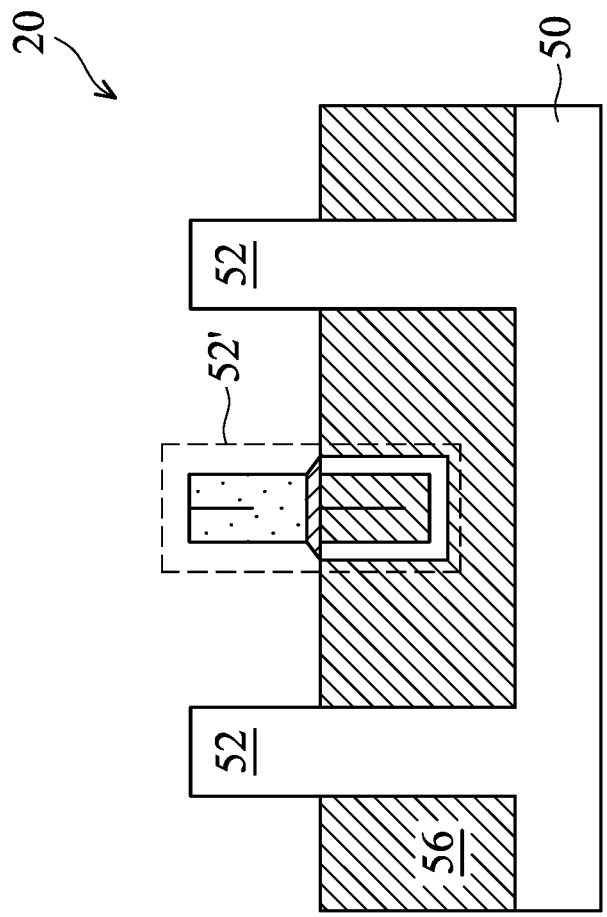

In FIGS. 36A-36B, the film 106 is etched and at least partially removed from sidewalls of the film 108. FIG. 36A illustrates embodiments where a top surface of the STI region 56 is lower than a top surface of the film 104; FIG. 36B illustrates embodiments where the top surface of the STI region 56 is higher than the top surface of the film 104; and FIG. 36C illustrate embodiments where the top surface of the STI region 56 is substantially level with the top surface of the film 104. Etching the film 104 may be performed using a similar process as described above with respect to FIG. 14. Thus, a dummy fin 52' is formed. The dummy fin 52' may be embedded in the STI region 56. For example, the STI region 56 may extend under and cover a bottom surface of the dummy fin 52'.

A middle portion of the dummy fin 52' has a width D2, which may be less than a width D1 of a bottom portion of the dummy fin 52'. By reducing the width D2 of the dummy fin 52', a space between the dummy fin 52' and the fins 52 can be increased. Thus, a gate material can be formed around the fins 52 and the dummy fin 52' with an enlarged process window, and manufacturing defects can be reduced.

Although FIGS. 36A-36C illustrate the dummy fin 52' as having a particular configuration, other embodiments contemplate a different configuration for the dummy fin 52' in the device 20. For example, any of the configurations described above with respect to FIGS. 15A through 15H could be incorporated into the device 20.

Figure 37A:
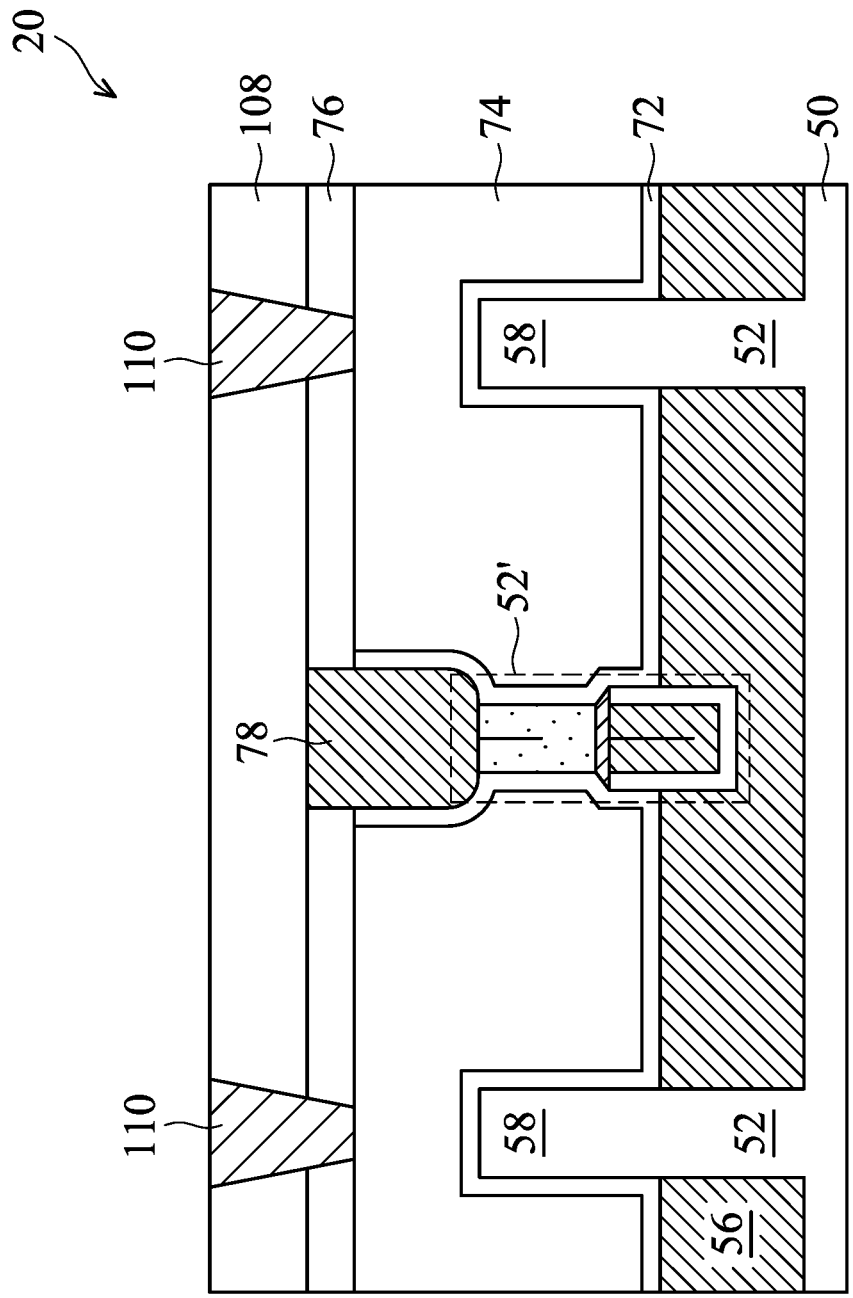
Figure 37B:
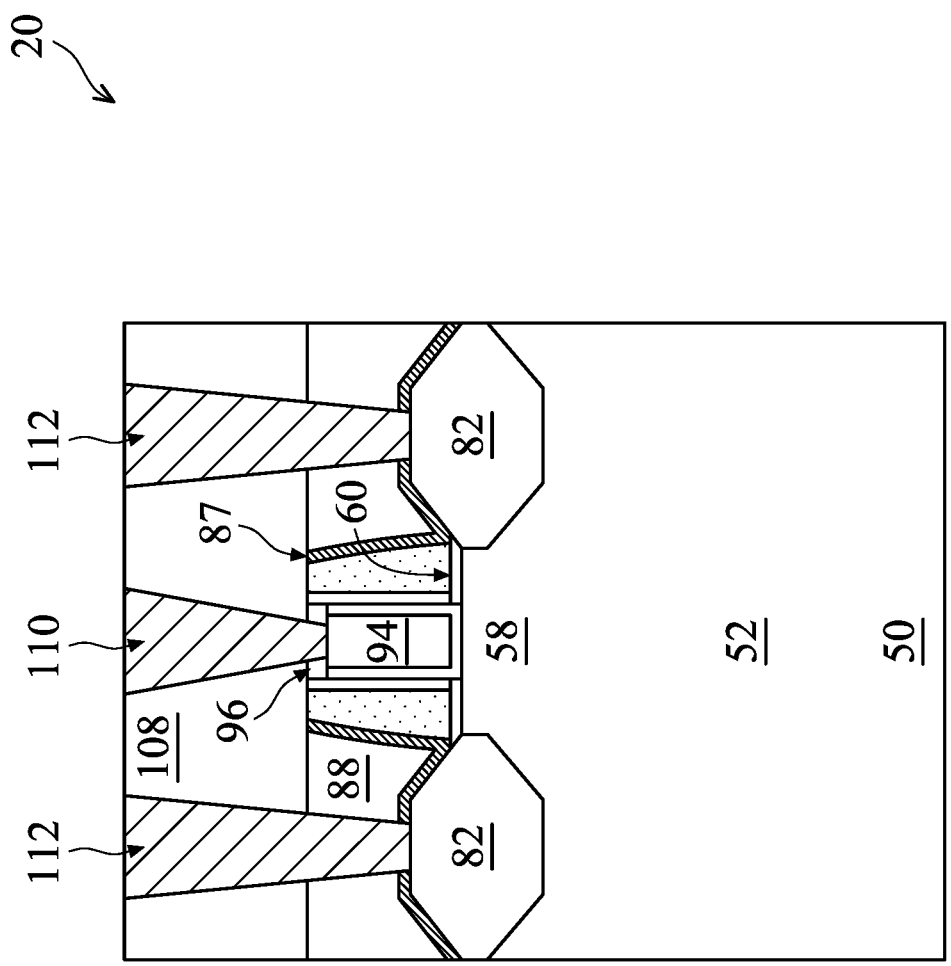
Figure 37C:
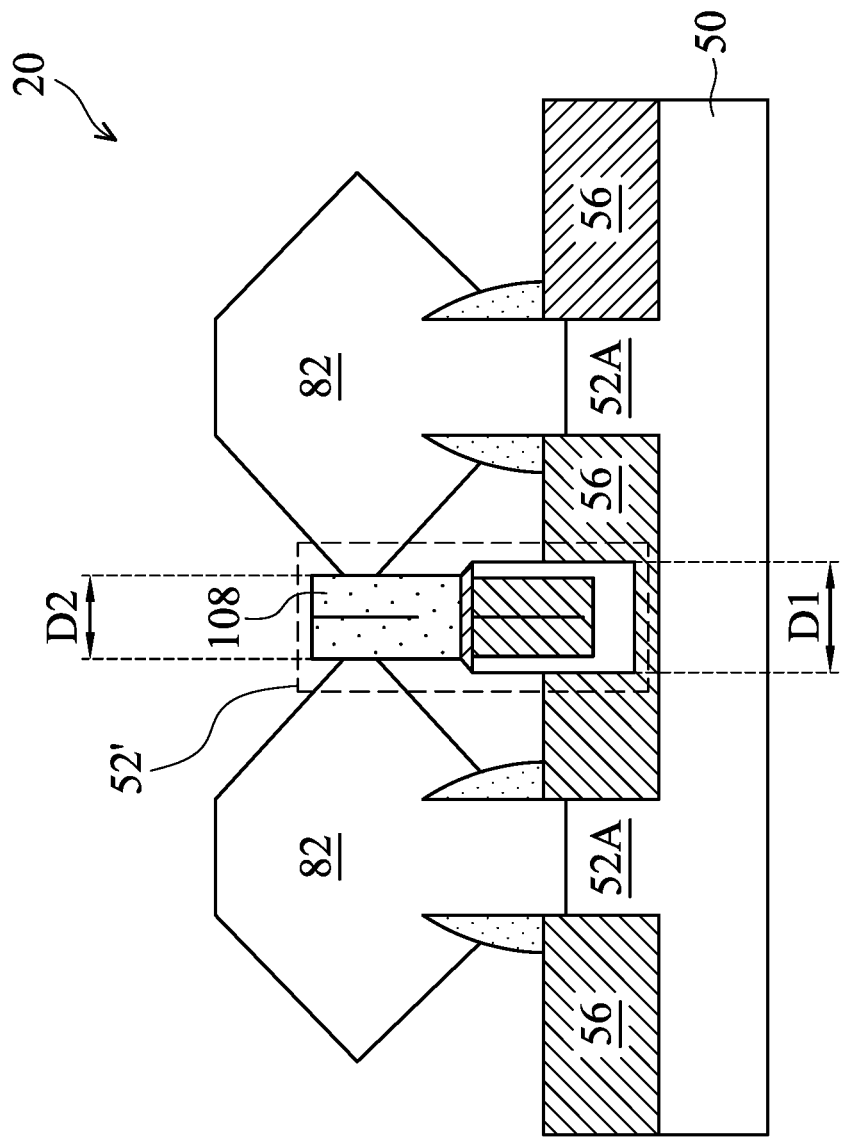

Subsequent processing may be performed on the device to form FinFETs. For example, similar processes as those described above with respect to FIGS. 16A through 28B may be performed to form source/drain regions 82 in the fins 52 and a gate stack over and along sidewalls of the fins 52 and the dummy fin 52'. The dummy fin 52' may physically separate adjacent source/drain regions 82, and a dielectric region 78 may extend through the gate stack to the dummy fin 52'. The resulting structure is illustrated in FIGS. 37A-37C.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are formed by patterning a stack of alternating layers of channel layers and sacrificial layers. The dummy gate stacks and source/drains are formed in a similar manner as described above. After the dummy gate stacks are removed, the sacrificial layers can be partially or fully removed in the channel regions. The replacement gate structures are formed in a similar manner as described above and will partially or completely surround the channel layers in the channel region of the NSFET devices. The ILDs and contacts to the gate structures and source/drains are formed in a similar manner as described above. A nanostructure device can be formed as disclosed in U.S. Patent Application Publication 2016/0365414, which is incorporated herein by reference in its entirety.

In various embodiments, a dummy fin may be used to separate metal gates of adjacent transistors. The dummy fin may also help isolate adjacent source/drain regions by, for example, preventing unintended source/drain merging during an epitaxial growth process. Various embodiments includes forming a first film on sidewalls and a bottom surface of a second film. The first film is then etched and at least partially removed from the sidewalls of the second film to reduce a width of the resulting dummy fin. Thus, a profile of the dummy fin can be improved. For example, a middle portion of the dummy fin may be less wide (e.g., have a smaller CD) than a bottom portion of the dummy fin. In this manner, a spacing between the dummy fin and the channel regions can be increased, and a process window for gate stack gap filling is enlarged.

In some embodiments, a device includes a first source/drain region over a semiconductor substrate; a dummy fin adjacent the first source/drain region, the dummy fin comprising: a first portion comprising a first film; and a second portion over the first portion, a width of the second portion being less than a width of the first portion, wherein the second portion comprises: a second film; and a third film between the first film and the second film, the third film being made of a different material than the first film and the second film; and a gate stack along sidewalls of the dummy fin. In some embodiments the third film extends along sidewalls of the second film. In some embodiments, the third film extends to a topmost surface of the second film. In some embodiments, a chemical bond energy of a material of the third film is less than a chemical bond energy of a material of the second film. In some embodiments, the first source/drain region contacts the second film. In some embodiments, the device further includes a second source/drain region on an opposing side of the dummy fin as the first source/drain region, wherein the second source/drain region contacts the second film. In some embodiments, the second portion further comprises a fourth film over the second film, and the fourth film is made of a different material than the second film. In some embodiments, the device further includes a dielectric region over and contacting the dummy fin, wherein the gate stack extends along sidewalls of the dielectric region. In some embodiments, a first surface of the third film adjoining the first film is less wide than a second surface of the third film adjoining the second film. In some embodiments, a first surface of the third film adjoining the first film is wider than a second surface of the third film adjoining the second film. In some embodiments, the third film has concave sidewalls.

In some embodiments, a device includes a first transistor at a top surface of a semiconductor substrate, the first transistor comprising: a first channel region; and a first gate stack over and along sidewalls of the first channel region; a second transistor at the top surface of the semiconductor substrate, the second transistor comprising: a second channel region; and a second gate stack over and along sidewalls of the second channel region; and a dummy fin physically separating the first gate stack from the second gate stack, wherein the dummy fin comprises: a first film; and a second film over the first film, wherein a width of the dummy fin measured at a level of the second film is less than a width of the dummy fin measured at a level of the first film. In some embodiments, the device further includes a spacer layer along sidewalls and a bottom surface of the first film. In some embodiments, the device further includes a third film between the first film and the second film. In some embodiments, the dummy fin is embedded in an isolation region. In some embodiments, the dummy fin contacts the semiconductor substrate.

In some embodiments, a method includes defining an opening between a first semiconductor fin and a second semiconductor fin; forming a dummy fin between the first semiconductor fin and the second semiconductor fin, forming the dummy fin comprising: depositing a first film in the opening; recessing the first film in the opening; depositing a second film in the opening over the first film; depositing a third film in the opening over the second film, the second film being disposed on sidewalls and a bottom surface of the third film; and etching the second film to at least partially remove the second film from the sidewalls of the third film; and forming a gate structure along sidewalls and top surfaces of the first semiconductor fin, the second semiconductor fin, and the dummy fin. In some embodiments, the method further includes prior to depositing the first film, depositing a spacer layer along sidewalls and a bottom surface of the opening, wherein depositing the first film comprises depositing the first film over the spacer layer. In some embodiments, forming the dummy fin further comprises: recessing the third film below a topmost surface of the second film; and depositing a fourth film in the opening over the third film, the second film being disposed on sidewalls of the fourth film. In some embodiments, etching the second film comprises a selective etch process that etches the second film at a faster rate than the third film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a dummy fin physically separating a first source/drain region from a second source/drain region, the dummy fin comprising:
   a first insulating region;
   a second insulating region over the first insulating region; and
   a third insulating region over the second insulating region, a width of the first insulating region being greater than a width of the third insulating region, the second insulating region being made of a different material than materials of the first insulating region and the third insulating region; and
   a gate stack on a sidewall of the dummy fin.

2. The device of claim 1, wherein the second insulating region extends along sidewalls of the third insulating region.

3. The device of claim 2, wherein a combined width of the third insulating region and the second insulating region measured at a top of the second insulating region is less than a width of the first insulating region.

4. The device of claim 2, wherein the second insulating region extends to a topmost surface of the third insulating region.

5. The device of claim 4, wherein a combined width of the third insulating region and the second insulating region measured at the topmost surface of the third insulating region is less than a width of the first insulating region.

6. The device of claim 1, wherein a chemical bond energy of a material of the third insulating region is greater than a chemical bond energy of a material of the second insulating region.

7. The device of claim 1, wherein the first source/drain region and the second source/drain region each contact the dummy fin.

8. The device of claim 1, wherein the second insulating region has concave sidewalls.

9. The device of claim 1, wherein a width of the second insulating region decreases in a direction from the first insulating region towards the third insulating region.

10. The device of claim 1, wherein a width of the second insulating region increases in a direction from the first insulating region towards the third insulating region.

11. The device of claim 1 further comprising a dielectric plug on a top surface of the dummy fin and a sidewall of the gate stack.

12. The device of claim 1, wherein the first insulating region comprises:
   a dielectric core; and
   a dielectric liner along sidewalls and a bottom surface of the dielectric core.

13. A device comprising:
   a first transistor on a semiconductor substrate, the first transistor comprising a first gate stack over and along sidewalls of a first semiconductor region;
   a second transistor on the semiconductor substrate and adjacent to the first transistor, the second transistor comprising a second gate stack over and along sidewalls of a second semiconductor region; and
   a dummy fin between the first gate stack and the second gate stack, wherein the dummy fin comprises:
   a first dielectric material; and
   a second dielectric material over the first dielectric material, wherein a bottom surface of the dummy fin is wider than a top surface of the dummy fin.

14. The device of claim 13 further comprising a third dielectric material over the second dielectric material, wherein a width of the second dielectric material changes along a line extending from the first dielectric material to the third dielectric material.

15. The device of claim 14, wherein the second dielectric material extends along sidewalls of the third dielectric material.

16. The device of claim 13 further comprising a dielectric liner along sidewalls and a bottom surface of the first dielectric material.

17. The device of claim 16, wherein the second dielectric material contacts a top surface of the dielectric liner and a top surface of the first dielectric material.

18. A semiconductor device comprising:
a first source/drain region in a first semiconductor fin;
a second source/drain region in a second semiconductor fin; and
an isolation fin physically separating the first source/drain region from the second source/drain region, wherein the isolation fin comprises:
a first dielectric region;
a second dielectric region over and made of a different material than the first dielectric region; and
a third dielectric region over the second dielectric region, wherein the third dielectric region is narrower than the second dielectric region at a surface of the first dielectric region.

19. The semiconductor device of claim 18 further comprising:
a first gate stack and a second gate stack, wherein the isolation fin is disposed between the first gate stack and the second gate stack; and
a dielectric plug over the isolation fin, the dielectric plug further being disposed between the first gate stack and the second gate stack.

20. The semiconductor device of claim 19, wherein top surfaces of the dielectric plug, the first gate stack, and the second gate stack are level.

* * * * *